US012805041B2

(12) United States Patent
Kwon

(10) Patent No.: US 12,805,041 B2
(45) Date of Patent: Nov. 17, 2026

(54) IMAGE SENSOR AND MANUFACTURING METHOD FOR AN IMAGE SENSOR REFLECTIVE LAYER

(71) Applicant: SAMSUNG ELECTRONICS CO., LTD., Suwon-si (KR)

(72) Inventor: Donghoon Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 538 days.

(21) Appl. No.: 18/367,570

(22) Filed: Sep. 13, 2023

(65) Prior Publication Data

US 2024/0313016 A1 Sep. 19, 2024

(30) Foreign Application Priority Data

Mar. 15, 2023 (KR) ........................ 10-2023-0034084

(51) Int. Cl.
*H10F 39/00* (2025.01)
*H10F 39/18* (2025.01)

(52) U.S. Cl.
CPC ....... *H10F 39/8053* (2025.01); *H10F 39/024* (2025.01); *H10F 39/18* (2025.01); *H10F 39/8063* (2025.01); *H10F 39/8067* (2025.01)

(58) Field of Classification Search
None
See application file for complete search history.

(56) References Cited

U.S. PATENT DOCUMENTS

| | | | |
|---|---|---|---|
| 5,696,629 A | 12/1997 | Berger et al. | |
| 8,686,527 B2 | 4/2014 | Ting et al. | |
| 10,651,220 B2 | 5/2020 | Huang et al. | |
| 10,651,225 B2 | 5/2020 | Huang et al. | |
| 12,032,186 B2 * | 7/2024 | Lee | G02B 5/201 |
| 12,108,169 B2 * | 10/2024 | Kim | G01J 3/0297 |
| 2010/0178480 A1 | 7/2010 | Perez et al. | |
| 2014/0268348 A1 | 9/2014 | Jewhurst et al. | |
| 2022/0128407 A1 | 4/2022 | Lee et al. | |
| 2022/0342129 A1 | 10/2022 | Lee et al. | |
| 2022/0342130 A1 | 10/2022 | Kim et al. | |

FOREIGN PATENT DOCUMENTS

| | | |
|---|---|---|
| KR | 10-2425204 B1 | 7/2022 |
| KR | 1020220122491 A | 9/2022 |

OTHER PUBLICATIONS

Schwenzer et al., Langmuir, 28, 10072-10081 (2012).

* cited by examiner

*Primary Examiner* — Jack S Chen
(74) *Attorney, Agent, or Firm* — Muir Patent Law, PLLC

(57) ABSTRACT

An image sensor, including a substrate, a plurality of photodiodes disposed within the substrate, a filter layer on the plurality of photodiodes, a plurality of color filters on the filter layer, and a plurality of micro lenses on the plurality of color filters, wherein the filter layer includes a lower reflective layer on the plurality of photodiodes, a bandpass filter on the lower reflective layer, transmitting light of a first wavelength band, and reflecting light of remaining wavelength bands, and an upper reflective layer on the bandpass filter, each of the lower and upper reflective layers including a porous material.

20 Claims, 25 Drawing Sheets

CF: CF1, CF2, CF3

IMAGE SENSOR AND MANUFACTURING METHOD FOR AN IMAGE SENSOR REFLECTIVE LAYER

CROSS-REFERENCE TO RELATED APPLICATION

Korean Patent Application No. 10-2023-0034084 filed in the Korean Intellectual Property Office on Mar. 15, 2023, is incorporated by reference herein in its entirety.

BACKGROUND

1. Field

An image sensor and a manufacturing method for an image sensor reflective layer is disclosed.

2. Description of the Related Art

A CMOS image sensor is a solid-state imaging device using a complementary metal-oxide semiconductor (CMOS). Compared to CCD image sensors with high-voltage analog circuit, CMOS image sensors have advantages of low manufacturing cost and low power consumption due to a small size of the device, so that they are mainly installed in home appliances in addition to portable devices such as smartphones and digital cameras.

SUMMARY

Embodiments are directed to an image sensor, including a substrate, a plurality of photodiodes disposed within the substrate, a filter layer on the plurality of photodiodes, a plurality of color filters on the filter layer, and a plurality of micro lenses on the plurality of color filters, wherein the filter layer includes a lower reflective layer on the plurality of photodiodes, a bandpass filter on the lower reflective layer, transmitting light of a first wavelength band, and reflecting light of remaining wavelength bands, and an upper reflective layer on the bandpass filter, each of the lower and upper reflective layers including a porous material.

Embodiments are directed to an image sensor, including a substrate, a plurality of photodiodes disposed within the substrate, a filter layer on the plurality of photodiodes, a plurality of color filters on the filter layer, and a plurality of micro lenses on the plurality of color filters, wherein the filter layer includes a lower reflective layer on the plurality of photodiodes, a first bandpass filter that is on the lower reflective layer, transmits light of a first wavelength band, and reflects light of remaining wavelength bands, and an upper reflective layer on the first bandpass filter, a porous metal oxide layer and a porous silicon oxide layer being alternately stacked in each of the lower and upper reflective layers.

Embodiments are directed to an image sensor, including a substrate, a plurality of photodiodes disposed within the substrate, a filter layer on the plurality of photodiodes, a plurality of color filters on the filter layer, and a plurality of micro lenses on the plurality of color filters, wherein the filter layer includes a lower reflective layer that is on the plurality of photodiodes and includes a first lower reflective layer and a second lower reflective layer sequentially stacked, an upper reflective layer that is on the lower reflective layer and includes a first upper reflective layer and a second upper reflective layer sequentially stacked, and a first bandpass filter between the lower reflective layer and the upper reflective layer, the first lower reflective layer and the second lower reflective layer include different porous inorganic oxides, and the first upper reflective layer and the second upper reflective layer include different porous inorganic oxides.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
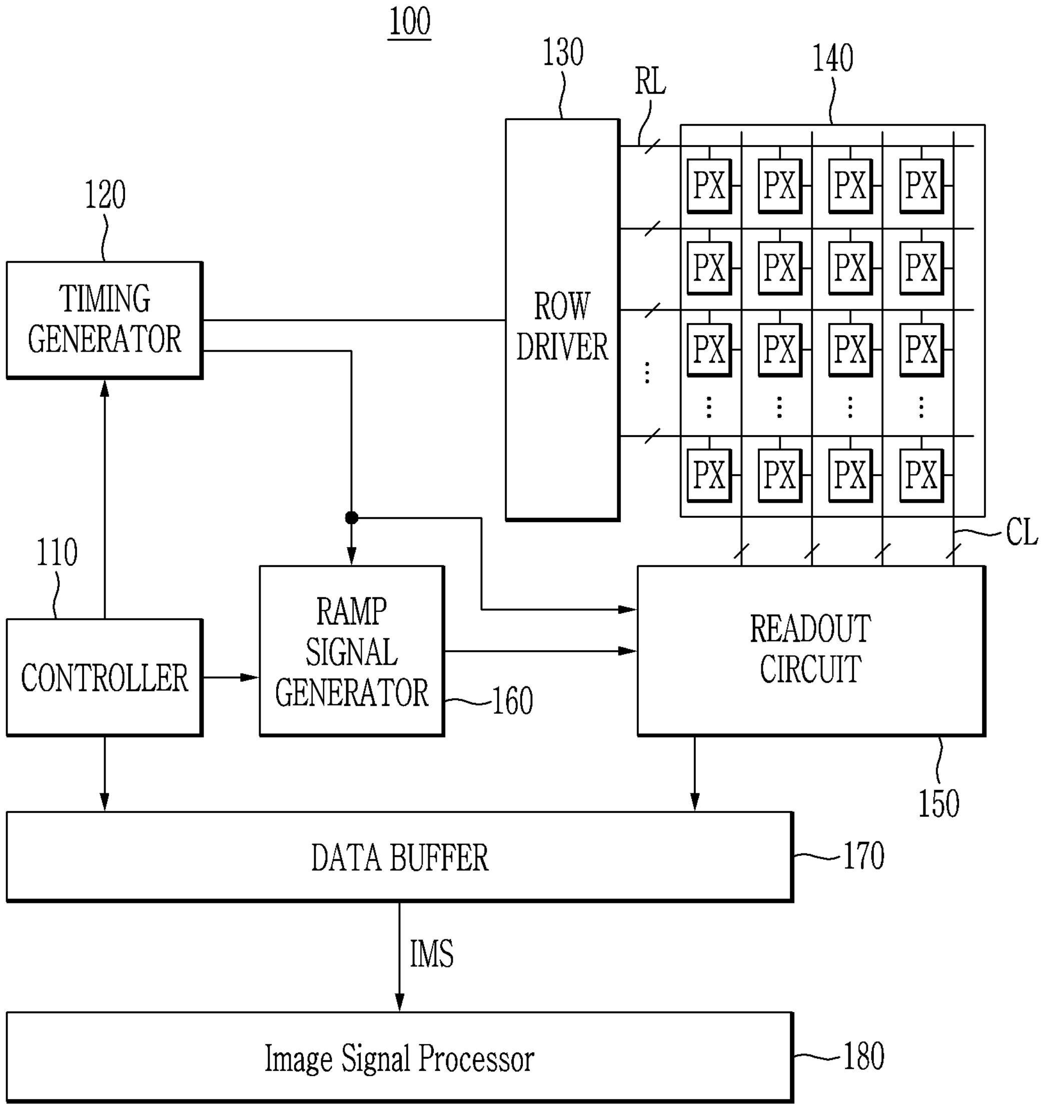
FIG. 1 is a schematic, block diagram showing an image sensor according to an example embodiment.

FIG. 1 is a schematic block diagram showing an image sensor according to an example embodiment. Referring to FIG. 1, an image sensor 100 according to an embodiment may include a pixel array 140 and a logic circuit controlling the pixel array 140.

The logic circuit is a circuit for controlling the pixel array 140, and may include, e.g., a controller 110, a timing generator 120, a row driver 130, a readout circuit 150, a ramp signal generator 160, and a data buffer 170.

In addition, the image sensor 100 may further include an image signal processor 180, and in some embodiments, the image signal processor 180 may be outside the image sensor 100. The image sensor 100 may generate an image signal by converting light received from the outside into an electrical signal. The image signal may be provided to the image signal processor 180.

The image sensor 100 may be mounted on an electronic device having an image or optical sensing function. In an implementation, the image sensor 100 may be mounted on electronic devices such as a camera, a smartphone, a wearable device, an Internet of things (IoT) device, a home appliance, a tablet personal computer (PC), a navigation device, a drone, or an advanced driver assistance systems (ADAS). In addition, the image sensor 100 may be mounted on an electronic device provided as a component in a vehicle, furniture, a manufacturing facility, a door, or various measurement devices. As used herein, the term "or" is not an exclusive term, e.g., "A or B" would include A, B, or A and B.

The pixel array 140 may include a plurality of pixels PX, and a plurality of row lines RL and a plurality of column lines CL respectively connected to the plurality of pixels PX.

In the embodiment, each pixel PX may include at least one photoelectric conversion element. The photoelectric conversion element may sense incident light and may convert the incident light into an electrical signal according to an amount of the light, that is, a plurality of analog pixel signals.

The photoelectric conversion element may be a photodiode (see 'PD' in FIG. 3), e.g., a pinned diode. In addition, the photoelectric conversion element may be a single-photon avalanche diode (SPAD) applied to a 3D sensor pixel.

The level of the analog pixel signal output from the photoelectric conversion element may be proportional to an amount of charge output from the photoelectric device. In an implementation, the level of the analog pixel signal output from the photoelectric conversion element may be determined according to an amount of light received into the pixel array 140.

The plurality of row lines RL may be connected to the plurality of pixels PX. In an implementation, a control signal outputted from the row driver 130 to the row line RL may be transmitted to a gate of a transistor of the plurality of pixels PX connected to the corresponding row line RL. The column line CL may cross the row line RL and may be connected to the plurality of pixels PX. The plurality of pixel signals outputted from the plurality of pixels PX may be transmitted to the readout circuit 150 through the plurality of column lines CL.

In the embodiment, the plurality of pixels PX may be disposed along a plurality of columns and a plurality of rows, and one analog pixel signal may be output for each pixel PX. In an implementation, the plurality of pixels PX may be grouped in the form of a plurality of columns and a plurality of rows to configure one unit pixel group. One unit pixel group may include a plurality of pixels PX arranged in the form of two columns and two rows, and one unit pixel group may output one analog pixel signal. The controller 110 may control an operation timing of each of the constituent elements 120, 130, 150, 160, and 170 described above by using control signals.

In the embodiment, the controller 110 may receive a mode signal indicating an imaging mode from an application processor and may overall control the image sensor 100 based on the received mode signal. In an implementation, the application processor may determine the imaging mode of the image sensor 100 according to various scenarios such as illumination of the imaging environment, user's resolution setting, a sensed or learned state, and may provide the determined result to the controller 110 as a mode signal.

The controller 110 may control the plurality of pixels PX of the pixel array 140 to output pixel signals according to the imaging mode, the pixel array 140 may output a pixel signal for each of the plurality of pixels PX or a pixel signal for some of the plurality of pixels PX, and the readout circuit 150 may sample and process pixel signals transmitted from the pixel array 140.

The timing generator 120 may generate a signal serving as a reference for operation timing of components of the image sensor 100. The timing generator 120 may control the timing of the row driver 130, the readout circuit 150, and the ramp signal generator 160. The timing generator 120 may provide a control signal for controlling the timing of the row driver 130, the readout circuit 150, and the ramp signal generator 160.

The row driver 130 may generate a control signal for driving the pixel array 140 in response to the control signal of the timing generator 120 and may provide control signals to the plurality of pixels PX of the pixel array 140 through the plurality of row lines RL.

In the embodiment, the row driver 130 may control the pixel PX to sense incident light in a row line unit. The row line unit may include at least one row line RL. In an implementation, the row driver 130 may generate a transmission signal for controlling a transmission transistor, a reset control signal for controlling a reset transistor, and a selection control signal for controlling a selection transistor to provide the generated signals to the pixel array 140.

The readout circuit 150 may convert the pixel signal (or electrical signal) from the pixel PX connected to the row line RL selected from the plurality of pixels PX in response to the control signal from the timing generator 120 into a pixel value representing the amount of light.

The readout circuit 150 may convert a pixel signal output through the corresponding column line CL into a pixel value. In an implementation, the readout circuit 150 may convert a pixel signal into a pixel value by comparing a ramp signal and a pixel signal. The pixel value may be image data having a plurality of bits. In an implementation, the readout circuit 150 may include a selector, a plurality of comparator, and a plurality of counter circuits.

The ramp signal generator 160 may generate a reference signal to transmit it to the readout circuit 150. The ramp signal generator 160 may include a current source, a resistor, and a capacitor. The ramp signal generator 160 adjusts a ramp voltage, which may be a voltage applied to a ramp resistor, by adjusting a current amount of a variable current source or a resistance value of a variable resistor, so that the ramp signal generator 160 may generate a plurality of ramp signals that fall or rise with a slope determined according to the current amount of the variable current source or the resistance value of the variable resistor.

The data buffer 170 may store pixel values of the plurality of pixels PX connected to the selected column line CL transmitted from the readout circuit 150 and may output the stored pixel values in response to an enable signal from the controller 110.

The image signal processor 180 may perform image signal processing on the image signal received from the data buffer 170. In an implementation, the image signal processor 180 may receive a plurality of image signals from the data buffer 170 and may synthesize the received image signals to generate one image. Hereinafter, an image sensor according to an embodiment will be described with reference to FIG. 2 and FIG. 3.

Figure 2:
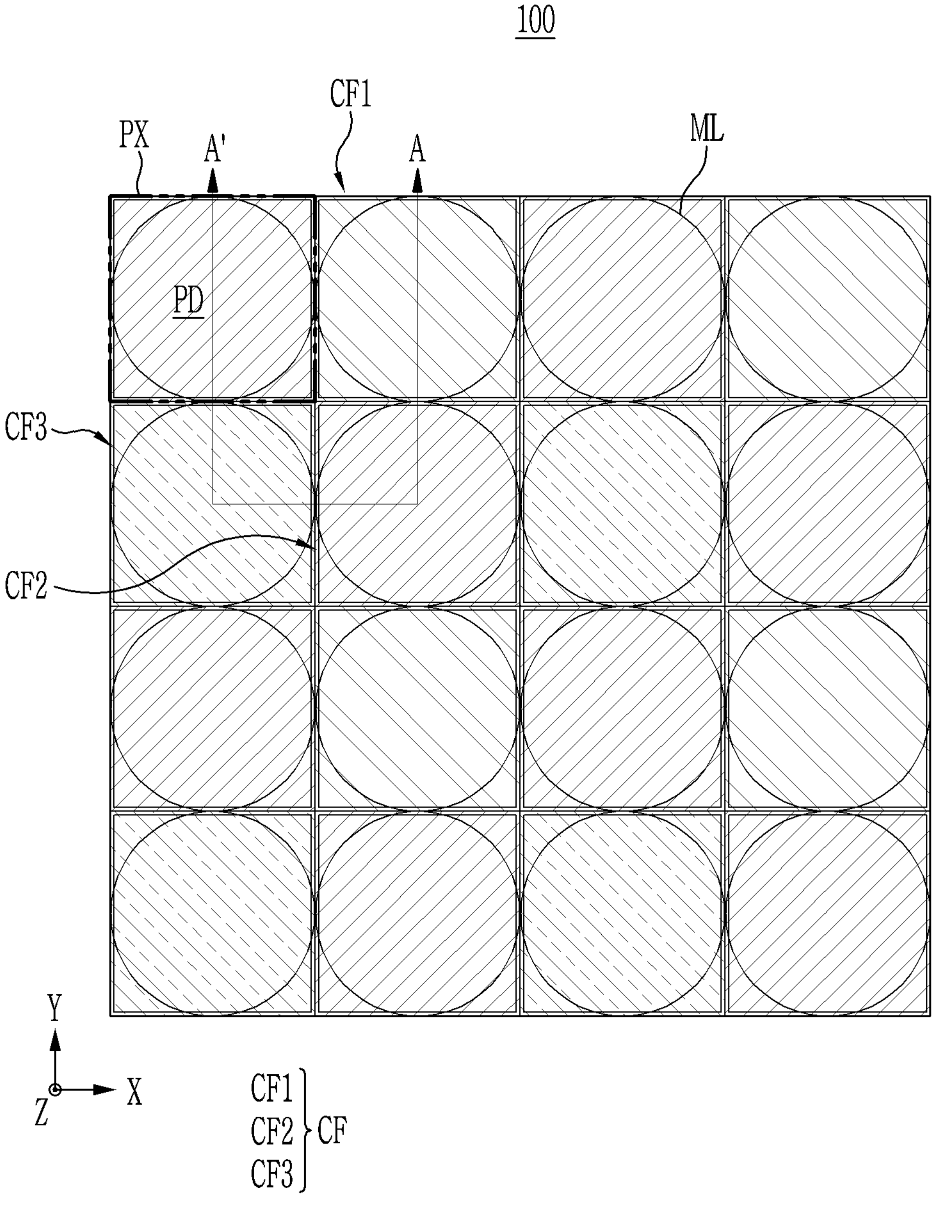
FIG. 2 shows a top, plan view showing an image sensor according to an example embodiment.
Figure 3:
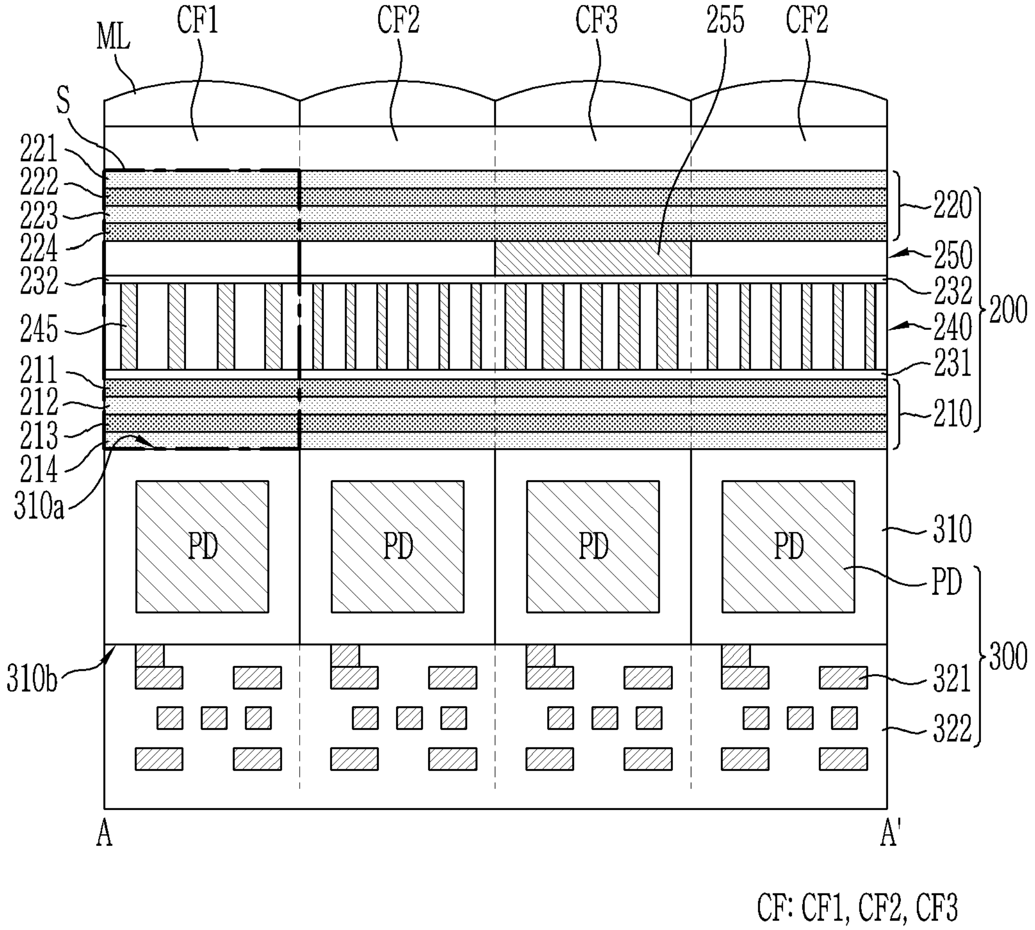
FIG. 3 is a cross-sectional view showing the image sensor shown in FIG. 2, taken along line A-A' of FIG. 2.

FIG. 2 shows a top plan view of an image sensor according to an example embodiment. FIG. 3 shows a cross-sectional view taken along line A-A' of FIG. 2. In an implementation, FIG. 2 illustrates a portion of a top plan view of the image sensor 100 according to the embodiment. Referring to FIG. 2 and FIG. 3, the image sensor 100 according to the embodiment may include a substrate 310, a plurality of pixels PX, a filter layer 200, color filters CF, and micro lenses ML.

The substrate 310 may be, e.g., a bulk silicon or a silicon-on-insulator (SOI). The substrate 310 may be a silicon substrate, or may include other materials, e.g., a silicon germanium, an indium antimonide, a lead tellurium compound, an indium arsenic, an indium phosphide, a gallium arsenic, or a gallium antimonide. Alternatively, the substrate 310 may have an epitaxial layer formed on a base substrate. The substrate 310 may be doped with conductive impurities. In an implementation, the substrate 310 may be doped with P-type conductive impurities.

The substrate 310 may include a first surface **310*a* and a second surface 310*b* facing each other. The first surface 310*a* of the substrate 310 may be a light receiving surface through which light may be incident. In addition, the first surface 310*a* may be the front surface of the substrate 310, and the second surface 310*b* may be the rear surface of the substrate 310**.

The plurality of pixels PX may be two-dimensionally arranged in a plan view. The plurality of pixels PX may be arranged along a plurality of rows and a plurality of columns. Each of the plurality of pixels PX may sense incident light. In an implementation, a pixel PX overlapping a first color filter CF1 may sense light of a first color, a pixel PX overlapping a second color filter CF2 may sense light of a second color different from the first color, and a pixel PX overlapping a third color filter CF3 may sense light of a third color different from the first and second colors.

Each of the plurality of pixels PX may include photodiodes PD, and a pixel circuit. The photodiodes PD for receiving light may be located in the substrate 310. Light incident from the outside may be converted into electrical signals by the photodiodes PD.

The photodiode PD may correspond to each pixel PX. In an implementation, the photodiodes PD may be disposed for each pixel PX overlapping each color filter CF. They may be doped with conductive impurities different from the conductive impurities doped on the substrate 310. In an implementation, the photodiodes PD may be doped with N-type conductive impurities.

A pixel circuit may be on the second surface **310*b* of the substrate 310. The pixel circuit may include wire patterns 321 respectively connected to the photodiodes PD, and a third insulating layer 322 covering the wire patterns 321**.

In some embodiments, the pixel circuit may further include a floating diffusion area. The floating diffusion area may be electrically connected to each other by at least one of the wire patterns 321.

In some embodiments, the image sensor 100 may further include an element separation film between adjacent pixels PX. The element separation film may be in a lattice shape in a plan view to separate the pixels PX from each other. The element separation film may extend in a third direction (Z direction) on in a cross-sectional view and may connect the first surface **310*a* and the second surface 310*b* of the substrate 310. The element separation film may not penetrate the substrate 310 and may be spaced apart from the second surface 310*b* of the substrate 310**.

Accordingly, the element separation film may be between adjacent photodiodes PD. The element separation film may be between the photodiodes PD to electrically and optically isolate adjacent photodiodes from each other. The element separation film may extend in a first direction (X direction) and a second direction (Y direction) in a plan view and may be between the photodiodes PD adjacent to each other.

The filter layer 200 may be on the first surface **310*a* of the substrate 310. The filter layer 200 may be between the color filter CF and the first surface 310*a* of the substrate 310. The filter layer 200 may cover an upper surface of the first surface 310*a* of the substrate 310. In an implementation, the upper surface of the filter layer 200 may contact the lower surface of the color filter CF, and the lower surface of the filter layer 200 may contact the upper surface of the first surface 310*a* of the substrate 310. Another layer may be further between the color filter CF and the filter layer 200, and another layer may be further between the first surface 310*a* of the substrate 310 and the filter layer 200**.

The filter layer 200 may transmit light of a specific wavelength band and may block light of the remaining wavelength bands. The filter layer 200 may transmit light having a specific central wavelength and may have a Fabry-Perot structure in which a resonant layer (e.g., a band pass filter) is provided between two reflective layers. Here, the central wavelength and the wavelength band of light passing through the band pass filter may be determined according to the reflective band of the reflective layers and the characteristics of the resonance layer. A description of the filter layer 200 will be described later with further reference from FIG. 4 to FIG. 7.

The color filters CF may be on the filter layer 200. The color filters CF may correspond to each of the plurality of pixels PX. In an implementation, each of the color filters CF may correspond to each of the photodiodes PD.

The color filters CF may include a first color filter CF1, a second color filter CF2, and a third color filter CF3. In an implementation, the first color filter CF1 may be a red color filter, the second color filter CF2 may be a green color filter, and the third color filter CF3 may be a blue color filter.

In the embodiment, the color filters CF may have a Bayer pattern in a plan view. In an implementation, the color filters CFs may have a pattern in which the number of the second color filters CF2 is about twice as many as the number of the first color filters CF1 or the third color filters CF3. In an implementation, in the color filters CF arranged in a 2×2 shape in a plan view, the Bayer pattern may include two second color filters CF2 disposed diagonally to each other, and the first color filter CF1 and the third color filter CF3 disposed diagonally to each other. Each of the first color filter CF1 and the third color filter CF3 may be between adjacent second color filters CF2. The color filters CF of the Bayer pattern may be repeatedly arranged along the first direction (X direction) and the second direction (Y direction).

In an implementation, the pixels PX of an N×M array may correspond to one color filter CF. Here, N and M may each independently be an integer greater than 1. In an implementation, when N and M are 2, four pixels PX may correspond to one color filter CF.

The micro lenses ML condensing light incident from the outside may be on each color filter CF. The micro lenses ML may correspond to the pixels PX. In an implementation, one micro lens ML may be on one pixel PX. In an implementation, when one color filter CF corresponds to one pixel PX, a ratio of the number of the color filters CF to the number of the micro lenses ML may be 1:1. In an implementation, the micro lens ML may be disposed at each of the first color filter CF1, the second color filter CF2, and the third color filter CF3.

In an implementation, the color filters CF of an N×M array may correspond to one microlens ML. Here, N and M may each independently be an integer greater than 1. In an implementation, when N and M are 2, four color filters CF may correspond to one micro lens ML.

In the embodiment, an upper surface of the micro lens ML may have a curved surface, unlike an upper surface of the color filter CF. The upper surface of the microlens ML may have a quadrangular shape having rounded corners. In some embodiments, upper surfaces of the color filters CF may have the same curved surface as the upper surface of the micro lens ML or may have a quadrangular shape with rounded corners. Hereinafter, a filter layer of an image sensor according to an embodiment will be described with further reference to FIG. 4 to FIG. 7.

Figure 4:
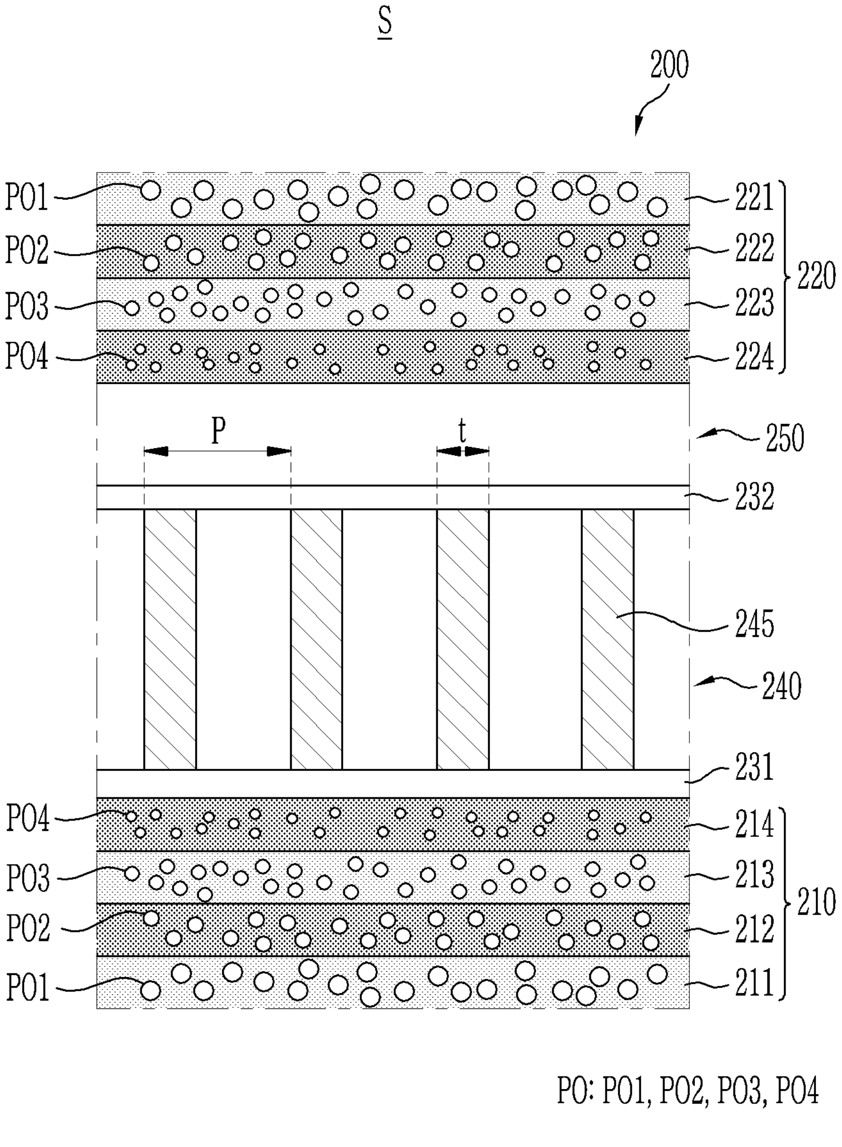
FIG. 4 is an enlarged, cross-sectional view showing an area "S" of the image sensor shown in FIG. 3.
Figure 5:
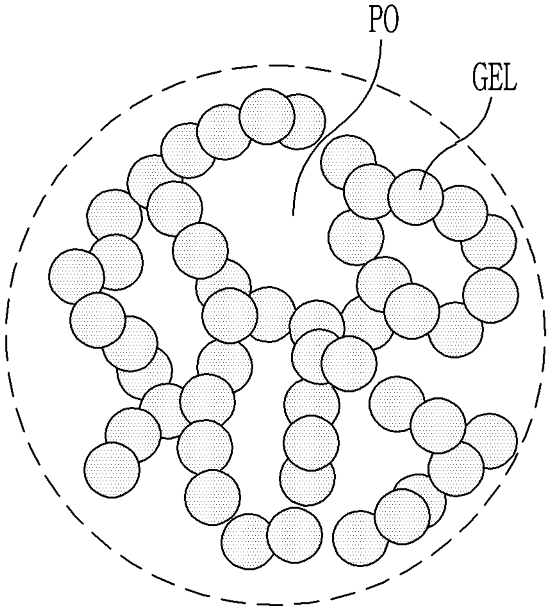
FIG. 5 is an enlarged view showing a material of a reflective layer according to an example embodiment.
Figure 6:
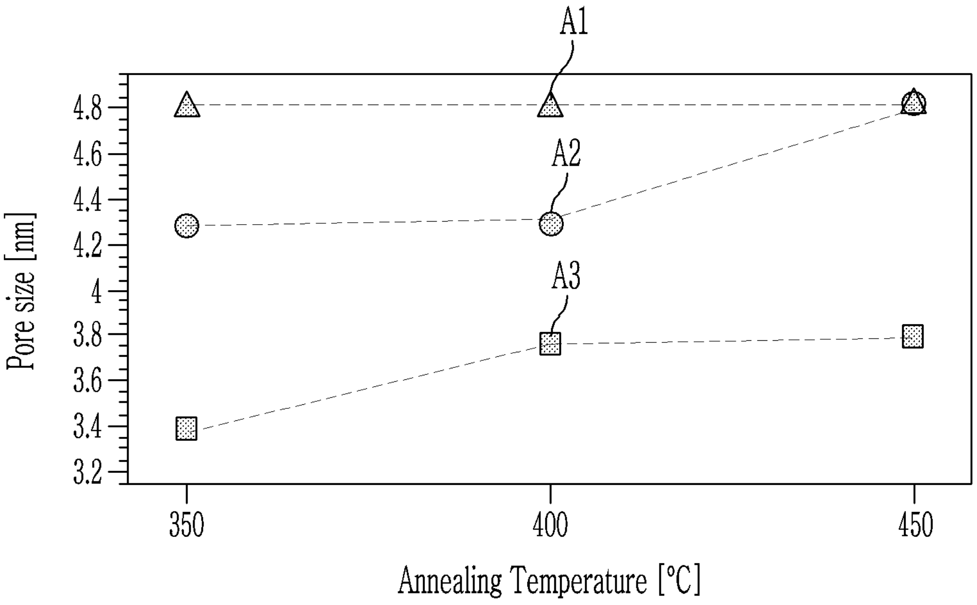
FIG. 6 is a graph showing pore sizes of a material of a reflective layer against annealing temperatures according to an example embodiment.
Figure 7:
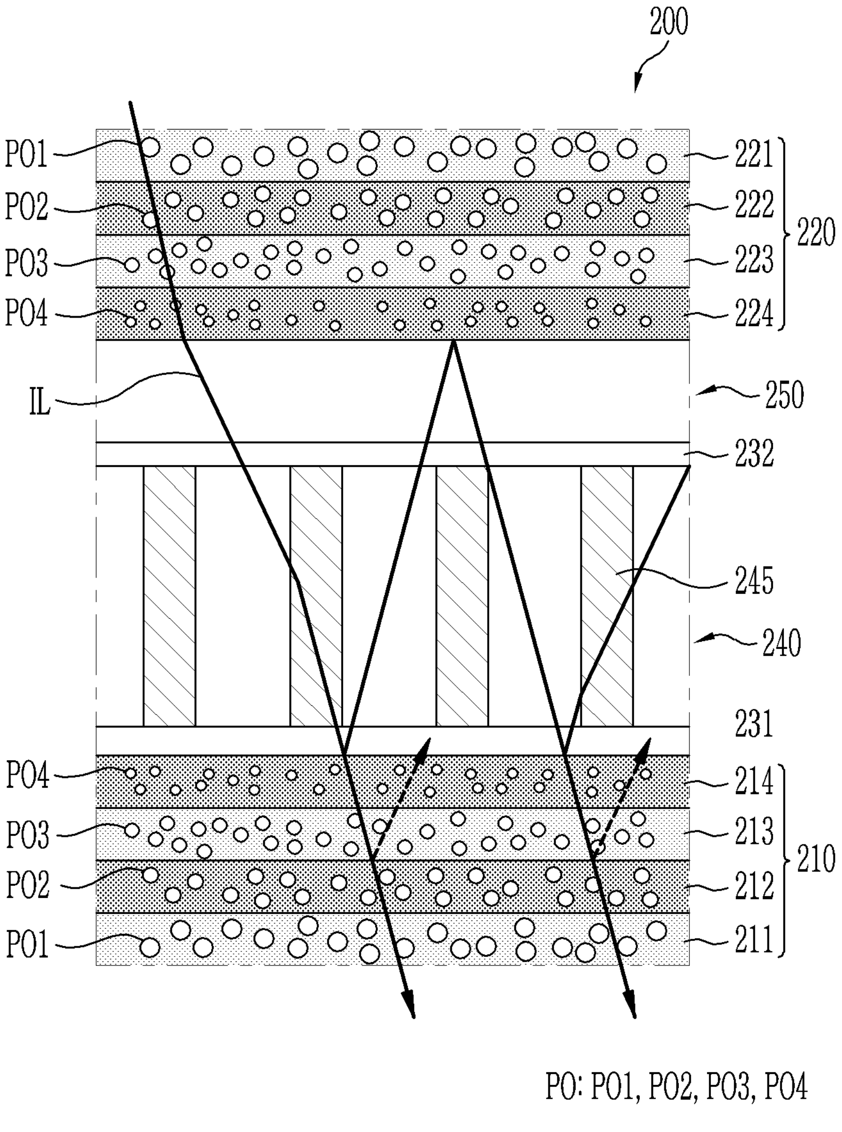
FIG. 7 is a cross-sectional view showing a path of light incident on a filter layer according to an embodiment.

FIG. 4 shows an enlarged cross-sectional view of area "S" of FIG. 3. FIG. 5 shows an enlarged view of a material of a reflective layer according to an example embodiment. FIG. 6 shows a graph of pore sizes of a material of a reflective layer against annealing temperatures according to an example embodiment. FIG. 7 shows a cross-sectional view of a path of light incident on a filter layer according to an embodiment.

Referring to FIG. 3 and FIG. 4, the filter layer 200 may include a lower reflective layer 210, an upper reflective layer 220, and first and second band pass filters 240 and 250 between the lower reflective layer 210 and the upper reflective layer 220. The lower reflective layer 210 and the upper reflective layer 220 may share the first and second band pass filters 240 and 250 to transmit light in a specific wavelength band determined by the first and second band pass filters 240 and 250 and to block light in the remaining wavelength bands.

The lower reflective layer 210 may be on the first surface 310*a* of the substrate 310. The lower reflective layer 210 may cover an upper surface of the first surface 310*a* of the substrate 310. In an implementation, the lower surface of the lower reflective layer 210 may contact the upper surface of the first surface 310*a* of the substrate 310. In addition, the upper reflective layer 220 may be on the lower surface of the color filter CF. The upper reflective layer 220 may cover the lower surface of the color filter CF. In an implementation, the upper surface of the upper reflective layer 220 may contact the lower surface of the color filter CF. Another layer may be between the first surface 310*a* of the substrate 310 and the lower reflective layer 210. In addition, another layer may be between the color filter CF and the upper reflective layer 220.

The lower reflective layer 210 and the upper reflective layer 220 may be Bragg reflective layers. Here, the Bragg reflective layer may be a distributed Bragg reflector (DBR). The lower reflective layer 210 and the upper reflective layer 220 may have symmetrical structures with respect to the first and second band pass filters 240 and 250. The lower reflective layer 210 and the upper reflective layer 220 may have a structure in which, e.g., a plurality of material layers having different refractive indices are alternately stacked. The Bragg reflective layer having this structure may reflect light by periodic fluctuations in the refractive index.

In an implementation, the lower reflective layer 210 may include first to fourth lower reflective layers 211, 212, 213, and 214 sequentially accumulated from the first surface 310*a* of the substrate 310.

Each of the first to fourth lower reflective layers 211, 212, 213, and 214 may include a porous material. In an implementation, each of the first to fourth lower reflective layers 211, 212, 213, and 214 may include a porous inorganic oxide. The first lower reflective layer 211 and the third lower reflective layer 213 may include a porous metal oxide including titanium (Ti), aluminum (Al), hafnium (Hf), zirconium (Zr), tantalum (Ta), or yttrium (Y). In an implementation, the first lower reflective layer 211 and the third lower reflective layer 213 may include a porous titanium oxide. In addition, the second lower reflective layer 212 and the fourth lower reflective layer 214 may include a porous silicon oxide.

Further referring to FIG. 5, each of the first to fourth lower reflective layers 211, 212, 213, and 214 may include a pore PO. In an implementation, when the first to fourth lower reflective layers 211, 212, 213, and 214 include inorganic oxides, the inorganic oxides may include the pores PO and aerogel. In an implementation, the first lower reflective layer 211 and the third lower reflective layer 213 may include titanium dioxide aerogel, and the second lower reflective layer 212 and the fourth lower reflective layer 214 may include silicon oxide aerogel. The porous inorganic oxide may be formed by a sol-gel method. This will be described later with reference to FIG. 13 to FIG. 22. The inorganic oxide may include xerogel.

Sizes of the first to fourth pores PO1 to PO4 of the first to fourth lower reflective layers 211, 212, 213, and 214 may be different. In an implementation, average diameters of the first to fourth pores PO1 to PO4 of the first to fourth lower reflective layers 211, 212, 213, and 214 may be different. In an implementation, the sizes of the pores PO in the first to fourth lower reflective layers 211, 212, 213, and 214 may decrease as the distance from the first surface 310*a* of the substrate 310 increases. In addition, the average diameter of the first pores PO1 of the first lower reflective layer 211 may be greater than the average diameter of the third pores PO3 of the third lower reflective layer 213. In addition, the average diameter of the second pores PO2 of the second lower reflective layer 212 may be greater than the average diameter of the fourth pores PO4 of the fourth lower reflective layer 214. In addition, the average diameter of the first pores PO1 of the first lower reflective layer 211 may be greater than the average diameter of the first pores PO1 of the second lower reflective layer 212. The average diameter of the third pores PO3 of the third lower reflective layer 213 may be greater than an average diameter of the fourth pores PO4 of the fourth lower reflective layer 214. The average diameter of the first pores PO1 of the first lower reflective layer 211 and the average diameter of the second pores PO2 of the second lower reflective layer 212 may be substantially the same. In addition, the average diameter of the third pores PO3 of the third lower reflective layer 213 and the average diameter of the fourth pores PO4 of the fourth lower reflective layer 214 may be substantially the same.

The sizes of the pores PO in the first to fourth lower reflective layers 211, 212, 213, and 214 may increase as the distance from the first surface 310*a* of the substrate 310 increases. The sizes of the pores PO in the first to fourth upper reflective layers 221, 222, 223, and 224 may decrease as the distance from the first surface 310*a* of the substrate 310 increases.

As the size of the pore PO of the porous inorganic oxide included in the lower reflective layer 210 according to the embodiment decreases, the refractive index of the porous inorganic oxide may increase. In addition, the refractive index of the porous inorganic oxide may increase as the porosity of the porous inorganic oxide decreases. The size of the pore PO of the porous inorganic oxide and the porosity of the porous inorganic oxide may be determined depending on a kind of precursor that forms gel (GEL), an amount of material added during hydrolysis polymerization, pH of the solution forming the gel (GEL), and a type of salt added.

In addition, referring further to FIG. 6, the average diameter of the pores PO of the porous inorganic oxide may be changed according to the annealing temperature of the gel (GEL). As the annealing temperature of the gel (GEL) increases, the average diameter of the pores PO of the porous inorganic oxide tends to increase. In an implementation, the average diameter of pores in each of second and third materials A2 and A3 when the annealing temperature of the gel (GEL) is 450° C. may be larger than that when it is 350° C. However, a first material A1 may not depend on the annealing temperature of the gel (GEL). In an implementation, when the annealing temperature of the gel (GEL) is 350° C. and 450° C., the average diameters of the pores of the first material A1 may be substantially the same.

Accordingly, further referring to FIG. 7, when external light IL transmits through the upper reflective layer 220 to be incident to the first and second band pass filters 240 and 250, the light travels back and forth between the first and upper reflective layers 220. In this process, the incident light IL causes constructive interference and destructive interference, light having a specific central wavelength that satisfies the constructive interference condition transmits through the lower reflective layer 210 to be emitted to the outside.

In this case, since the average diameter of the first pores PO1 of the first lower reflective layer 211 may be greater than the average diameter of the third pores PO3 of the third lower reflective layer 213, the refractive index of the third lower reflective layer 213 may be greater than the refractive index of the first lower reflective layer 211. In addition, since the average diameter of the second pores PO2 of the second lower reflective layer 212 may be greater than the average diameter of the fourth pores PO4 of the fourth lower reflective layer 214, the refractive index of the fourth lower reflective layer 214 may be greater than the refractive index of the second lower reflective layer 212. Accordingly, the frequency of reflection by the third lower reflective layer 213 may be increased more than that by the first lower reflective layer 211, and the frequency of reflection by the fourth lower reflective layer 214 may be increased than that by the second lower reflective layer 212. Accordingly, reflectance of the lower reflective layer 210 may be improved.

The upper reflective layer 220 may include a fourth upper reflective layer 224, a third upper reflective layer 223, a second upper reflective layer 222, and a first upper reflective layer 221 sequentially disposed on the second band pass filter 250. The number of the upper reflective layers may be changed to correspond to the number of the lower reflective layers.

The upper reflective layer 220 and the lower reflective layer 210 may have symmetrical structures with respect to the first and second band pass filters 240 and 250. In an implementation, the fourth upper reflective layer 224 may include the same material as the fourth lower reflective layer 214, and the third upper reflective layer 223 may include the same material as the third lower reflective layer 213. In addition, the second upper reflective layer 222 may include the same material as the second lower reflective layer 212, and the first upper reflective layer 221 may include the same material as the first lower reflective layer 211. In an implementation, the first upper reflective layer 221 and the third upper reflective layer 223 may include a porous metal oxide including titanium (Ti), aluminum (Al), hafnium (Hf), zirconium (Zr), tantalum (Ta), or yttrium (Y). In addition, the second upper reflective layer 222 and the fourth upper reflective layer 224 may include a porous silicon oxide.

Each of the first to fourth upper reflective layers 221, 222, 223, and 224 may include the pore PO. In an implementation, when the first to fourth upper reflective layers 221, 222, 223, and 224 include inorganic oxides, the inorganic oxides may include the pores PO and aerogel. In an implementation, the second upper reflective layer 222 and the fourth upper reflective layer 224 may include titanium dioxide aerogel, and the first upper reflective layer 221 and the third upper reflective layer 223 may include silicon oxide aerogel. The porous inorganic oxide may be formed by a sol-gel method. The inorganic oxide may include xerogel.

The average diameters of the first to fourth pores PO1 to PO4 of the first to fourth upper reflective layers 221, 222, 223, and 224 may be different. The average diameter of the first to fourth pores PO1 to PO4 in each of the first to fourth upper reflective layers 221, 222, 223, and 224 and the average diameter of the first to fourth pores PO1 to PO4 in each of the first to fourth lower reflective layers 211, 212, 213, and 214 may be substantially the same. In an implementation, the sizes of the pores PO in the first to fourth upper reflective layers 221, 222, 223, and 224 may increase as the distance from the first surface 310*a* of the substrate 310 increases.

The average diameter of the first pores PO1 of the first upper reflective layer 221 may be greater than the average diameter of the third pores PO3 of the third upper reflective layer 223. Accordingly, the refractive index of the third upper reflective layer 223 may be greater than that of the first upper reflective layer 221. In addition, the average diameter of the second pores PO2 of the second upper reflective layer 222 may be greater than the average diameter of the fourth pores PO4 of the fourth upper reflective layer 224. Accordingly, the refractive index of the fourth upper reflective layer 224 may be greater than that of the second upper reflective layer 222. Accordingly, the frequency of reflection by the third lower reflective layer 213 may be increased more than that by the first lower reflective layer 211, and the frequency of reflection by the fourth lower reflective layer 214 may be increased than that by the second lower reflective layer 212. Accordingly, reflectance of the reflective layer may be improved.

Referring to FIG. 4, the first and second band pass filters 240 and 250 may be sequentially disposed on the lower reflective layer 210. The first and second band pass filters 240 and 250 may be between the lower reflective layer 210 and the upper reflective layer 220. Here, the first and second band pass filters 240 and 250 may serve to increase reflectivity in a very narrow wavelength area by generating guided mode resonance (GMR). In an implementation, the first and second band pass filters 240 and 250 may amplify and transmit only light of a specific wavelength band and may reflect light of the remaining wavelength bands.

To this end, the first and second band pass filters 240 and 250 may include a plurality of reflective structures 245 and 255 that are periodically disposed to cause guided mode resonance (GMR). Here, the reflective structures 245 and 255 may be disposed with a pitch P smaller than a resonance wavelength corresponding to the filter layer 200.

In the embodiment, the reflective structures 245 and 255 configuring the first band pass filter 240 may be on the lower reflective layer 210. In an implementation, each of the reflective structures 245 and 255 may have a line shape having a predetermined width and thickness t, and the reflective structures 245 and 255 may be in parallel in one direction with a predetermined pitch P. FIG. 4 illustrates a case in which each of the reflective structures 245 and 255 has a quadrangular cross-section. Each of the reflective structures 245 and 255 may have a cross-section of another polygonal shape such as a triangular shape.

The reflective structures 245 and 255 may include a semiconductor material having a predetermined refractive index. In an implementation, the reflective structures 245 and 255 may be made of a titanium dioxide $TiO_2$. The reflective structures 245 and 255 may include, e.g., GaAs, GaP, or SiN. Meanwhile, the reflective structures 245 and 255 may be made of various materials according to a design condition such as a wavelength of incident light.

In the embodiment, the resonant wavelength of each of the first and second band pass filters 240 and 250 may be determined by at least one of the pitch P, the thickness t, and the duty cycle of the reflective structures 245 and 255. Accordingly, by changing at least one of the pitch P, the thickness t, and the duty cycle of the reflective structures 245 and 255 configuring the first band pass filter 240, the filter layers 200 having different resonance wavelengths may be easily implemented. In an implementation, the material and shape of the reflective structures 245 and 255 are adjusted to be the same in the first and second band pass filters 240 and 250, and the pitch P or thickness t thereof are adjusted to be different in the first and second band pass filters 240 and 250, so that they may have different resonant wavelengths. The filter layer 200 according to the embodiment may further include a first insulating layer 231 and a second insulating layer 232.

The first insulating layer 231 may be on the upper surface of the lower reflective layer 210. The first insulating layer 231 may extend along the upper surface of the lower reflective layer 210. The first insulating layer 231 may include an insulating material. In an implementation, the first insulating layer 231 may include a silicon oxide, a silicon nitride, a silicon oxynitride, an aluminum oxide, or a hafnium oxide.

In some embodiments, the first insulating layer 231 may include a multi-film. In an implementation, the first insulating layer 231 may include an aluminum oxide film, a hafnium oxide film, a silicon oxide film, a silicon nitride film, and a hafnium oxide film sequentially stacked on the upper surface of the lower reflective layer 210.

The second insulating layer 232 may be on the upper surface of the first band pass filter 240. The second insulating layer 232 may extend along the upper surface of the first band pass filter 240. The second insulating layer 232 may include an insulating material. In an implementation, the second insulating layer 232 may include a silicon oxide, a silicon nitride, a silicon oxynitride, an aluminum oxide, or a hafnium oxide.

In some embodiments, the second insulating layer 232 may include a multi-film. In an implementation, the second insulating layer 232 may include an aluminum oxide film, a hafnium oxide film, a silicon oxide film, a silicon nitride film, and a hafnium oxide film sequentially stacked on the upper surface of the first band pass filter 240.

The first insulating layer 231 and the second insulating layer 232 may function as antireflection films to prevent reflection of light incident on the photodiodes PD. In addition, the first insulating layer 231 and the second insulating layer 232 may function as planarization films contributing to the color filter CF and the micro lenses ML having a uniform height.

In the image sensor 100 according to the embodiment, the lower reflective layer 210 and the upper reflective layer 220 may include a porous inorganic oxide including the pores PO, so that the refractive index of each reflective layer may be adjusted. Accordingly, the reflectance of the lower reflective layer 210 and the upper reflective layer 220 are adjusted, thereby effectively causing constructive interference and destructive interference in the filter layer 200. Accordingly, optical characteristics may be improved by effectively transmitting light of a specific wavelength band. Hereinafter, other embodiments of the image sensor will be described with reference to FIG. 8 to FIG. 12.

Figure 8:
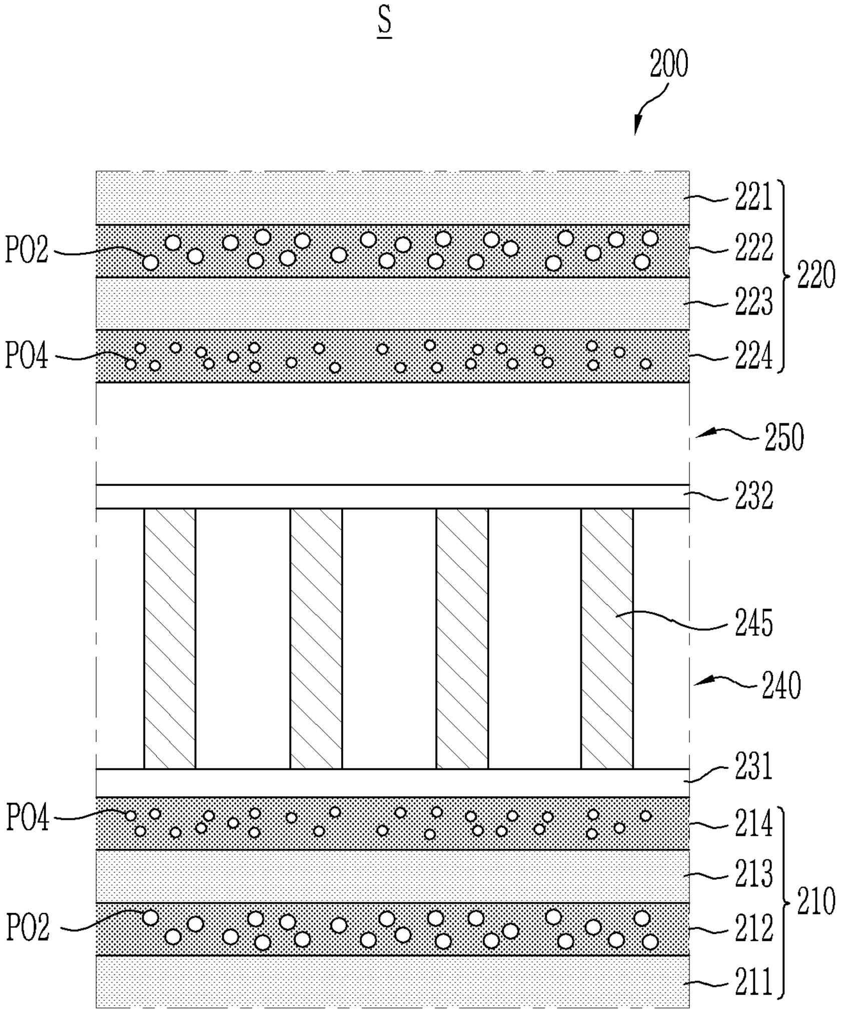
FIG. 8 is a cross-sectional view of a corresponding area "S" shown in FIG. 3, showing a second upper reflective layer having second pores, a fourth upper reflective layer having fourth pores, a fourth lower reflective layer having fourth pores, and a second lower reflective layer having second pores.
Figure 9:
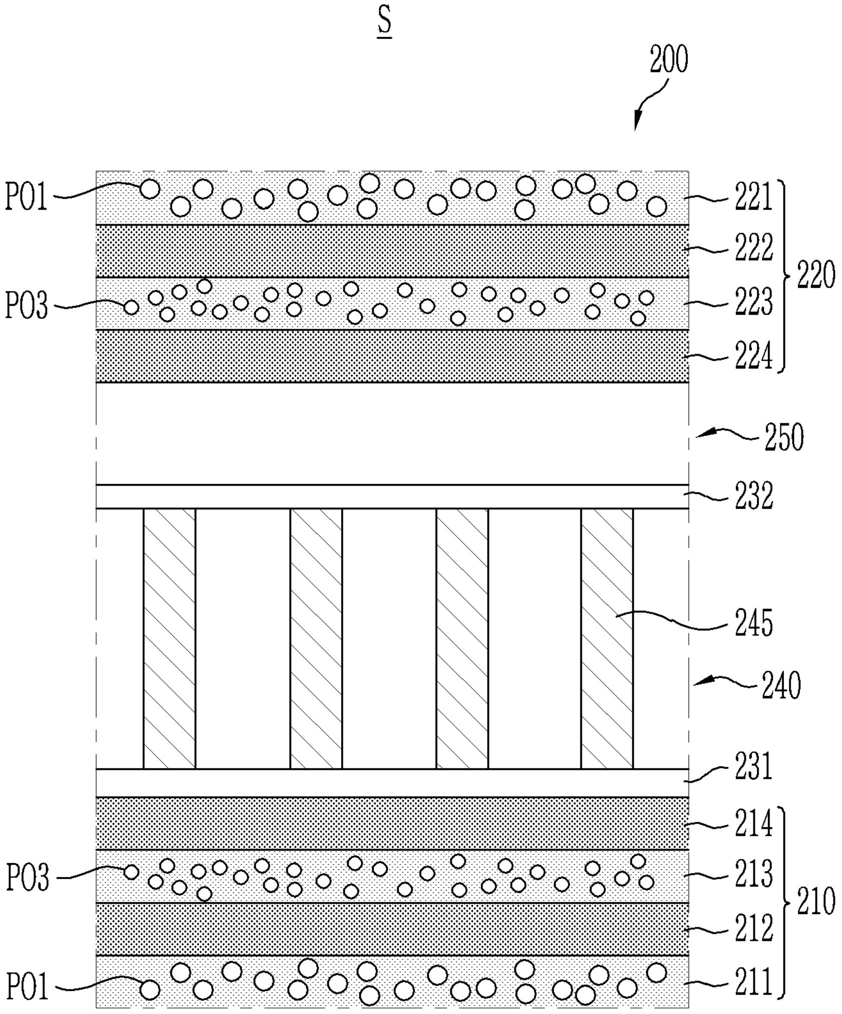
FIG. 9 is a cross-sectional view of a corresponding area "S" in FIG. 3 showing first through fourth upper reflective layers respectively having first through fourth pores, and first through fourth lower reflective layers respectively having first through fourth pores.

FIG. 8 shows a cross-sectional view corresponding to area "S" of FIG. 3 illustrating a second upper reflective layer having second pores, a fourth upper reflective layer having fourth pores, a fourth lower reflective layer having fourth pores, and a second lower reflective layer having second pores. FIG. 9 shows a cross-sectional view corresponding to area "S" of FIG. 3 illustrating first through fourth upper reflective layers respectively having first through fourth pores, and first through fourth lower reflective layers respectively having first through fourth pores.

A manufacturing method of a semiconductor device according to an embodiment shown in FIG. 8 and FIG. 9 may be considerably the same as the manufacturing method of the semiconductor device according to the embodiment shown in FIG. 1 to FIG. 7, so differences will be mainly described. In addition, the same reference numerals are used for components that are the same as those of the previous embodiment. In the present embodiment, the portion including the porous material in the first reflective layer and the second reflective layer is partially different from the previous embodiment and will be described below.

Referring to FIG. 8 and FIG. 9, like the previous embodiment, the image sensor 100 may include a substrate 310, a plurality of pixels PX, a filter layer 200, color filters CF, and micro lenses ML. The filter layer 200 may include a lower reflective layer 210, an upper reflective layer 220, and first and second band pass filters 240 and 250 between the lower reflective layer 210 and the upper reflective layer 220.

In the lower reflective layer 210 of the previous embodiment, the first to fourth lower reflective layers 211, 212, 213, and 214 may each include a porous material. Some layers of the lower reflective layer 210 of the present embodiment may not include a porous material. In an implementation, as shown in FIG. 8, the second lower reflective layer 212 and the fourth lower reflective layer 214 may include a porous material. In addition, the first lower reflective layer 211 and the third lower reflective layer 213 may not include a porous material. In this case, the first lower reflective layer 211 and the third lower reflective layer 213 may include an inorganic oxide. In an implementation, the first lower reflective layer 211 and the third lower reflective layer 213 may include a metal oxide including titanium (Ti), aluminum (Al), hafnium (Hf), zirconium (Zr), tantalum (Ta), or yttrium (Y).

In addition, the second upper reflective layer 222 and the fourth upper reflective layer 224 may include a porous material. In addition, the first upper reflective layer 221 and the third upper reflective layer 223 may not include a porous material. In this case, the first upper reflective layer 221 and the third upper reflective layer 223 may include an inorganic oxide. In an implementation, the first upper reflective layer 221 and the third upper reflective layer 223 may include a metal oxide including titanium (Ti), aluminum (Al), hafnium (Hf), zirconium (Zr), tantalum (Ta), or yttrium (Y).

For another example, as shown in FIG. 9, the first lower reflective layer 211 and the third lower reflective layer 213 may include a porous material. In addition, the second lower reflective layer 212 and the fourth lower reflective layer 214 may not include a porous material. In this case, the second lower reflective layer 212 and the fourth lower reflective layer 214 may include an inorganic oxide. In an implementation, the second lower reflective layer 212 and the fourth lower reflective layer 214 may include a porous silicon oxide.

In addition, the first upper reflective layer 221 and the third upper reflective layer 223 may include a porous material. In addition, the second upper reflective layer 222 and the fourth upper reflective layer 224 may not include a porous material. In this case, the second upper reflective layer 222 and the fourth upper reflective layer 224 may include an inorganic oxide. In an implementation, the second upper reflective layer 222 and the fourth upper reflective layer 224 may include a porous silicon oxide. Accordingly, penetration of an inorganic oxide solvent into the pores PO may be prevented in the process of forming the pores PO, so that the size (e.g., the average diameter) of the pores PO or the porosity of the first reflective layer 210 and the second reflective layer 220 may be easily adjusted.

Figure 10:
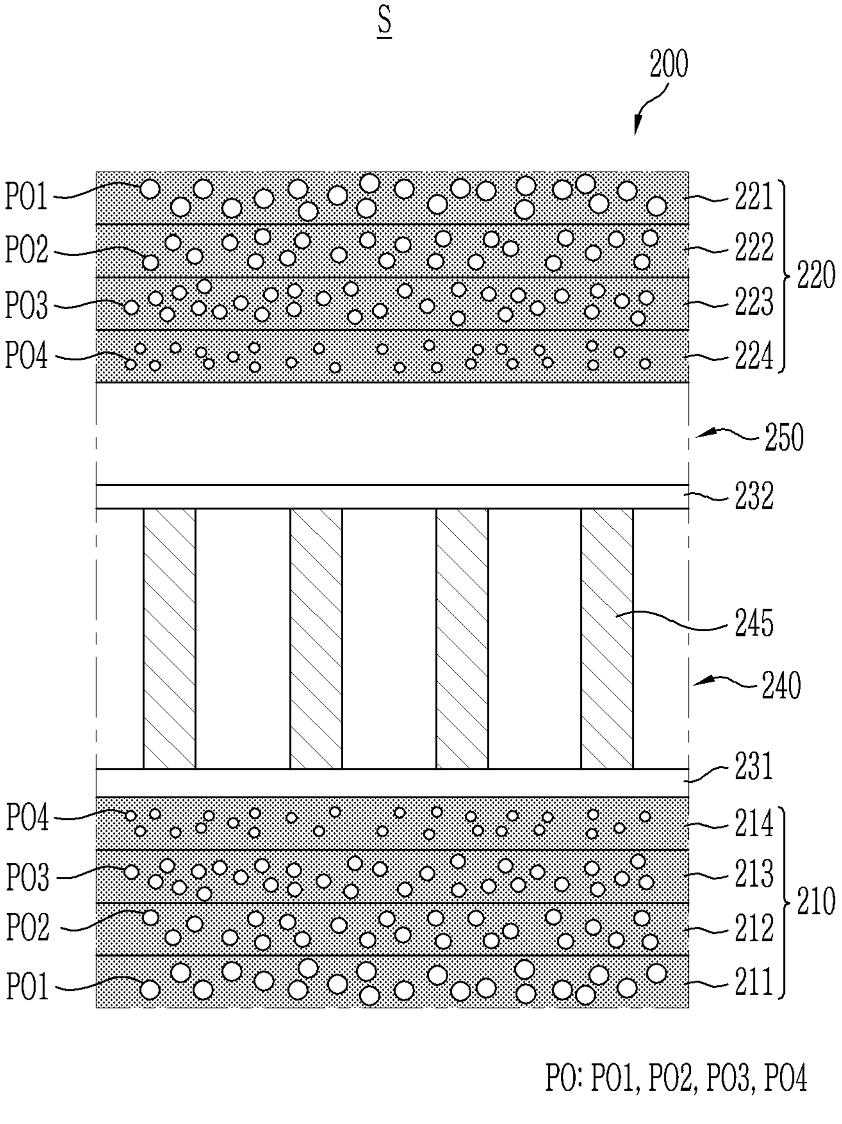
FIG. 10 is a cross-sectional view of a corresponding area "S" in FIG. 3 showing a second upper reflective layer having second pores, a fourth upper reflective layer having fourth pores, a fourth lower reflective layer having fourth pores, and a second lower reflective layer having second pores.
Figure 11:
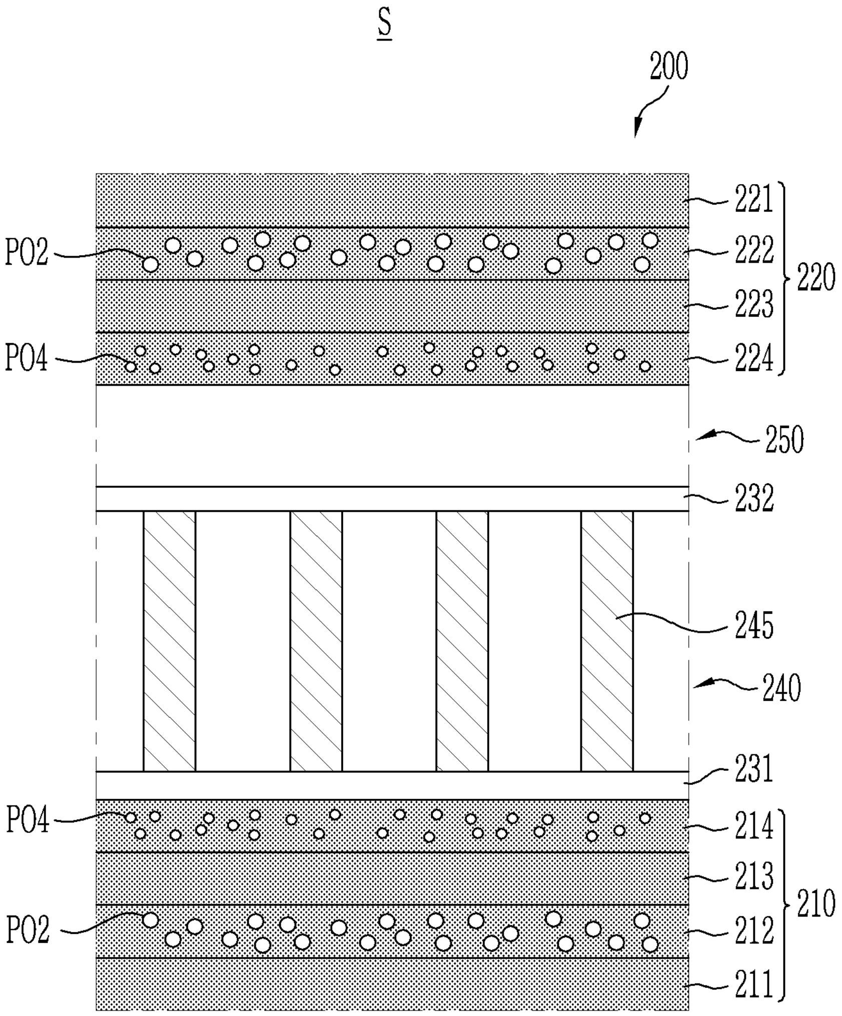
FIG. 11 is a cross-sectional view of a corresponding area "S" in FIG. 3 showing a second upper reflective layer having second pores, a fourth upper reflective layer having fourth pores, a fourth lower reflective layer having fourth pores, and a second lower reflective layer having second pores.

FIG. 10 shows a cross-sectional view corresponding to area "S" of FIG. 3 illustrating a second upper reflective layer having second pores, a fourth upper reflective layer having fourth pores, a fourth lower reflective layer having fourth pores, and a second lower reflective layer having second pores. FIG. 11 shows a cross-sectional view corresponding to area "S" of FIG. 3 illustrating a second upper reflective layer having second pores, a fourth upper reflective layer having fourth pores, a fourth lower reflective layer having fourth pores, and a second lower reflective layer having second pores.

A manufacturing method of a semiconductor device according to an embodiment shown in FIG. 10 and FIG. 11 may be considerably the same as the manufacturing method of the semiconductor device according to the embodiment shown in FIG. 1 to FIG. 7, so differences will be mainly described. In addition, the same reference numerals are used for components that are the same as those of the previous embodiment. In the present embodiment, materials configuring the first reflective layer and the second reflective layer are partially different from those of the previous embodiment and will be described below.

Referring to FIG. 10 and FIG. 11, like the previous embodiment, the image sensor 100 may include a substrate 310, a plurality of pixels PX, a filter layer 200, color filters CF, and micro lenses ML. The filter layer 200 may include a lower reflective layer 210, an upper reflective layer 220, and first and second band pass filters 240 and 250 between the lower reflective layer 210 and the upper reflective layer 220.

The lower reflective layer 210 and the upper reflective layer 220 of the previous embodiment may have a structure in which, e.g., a plurality of material layers having different refractive indices are alternately stacked. The first to fourth lower reflective layers 211, 212, 213, and 214 and the first to fourth upper reflective layers 221, 222, 223, and 224 of the lower reflective layer 210 of the present embodiment may include the same material.

The first to fourth lower reflective layers 211, 212, 213, and 214 and the first to fourth upper reflective layers 221, 222, 223, and 224 may include a porous inorganic oxide. In an implementation, as shown in FIG. 10, the first to fourth lower reflective layers 211, 212, 213, and 214 and the first to fourth upper reflective layers 221, 222, 223, and 224 may include a porous inorganic oxide. In an implementation, the first to fourth lower reflective layers 211, 212, 213, and 214 and the first to fourth upper reflective layers 221, 222, 223, and 224 may include a porous metal oxide including titanium (Ti), aluminum (Al), hafnium (Hf), zirconium (Zr), tantalum (Ta), or yttrium (Y). Alternatively, the first to fourth lower reflective layers 211, 212, 213, and 214 and the first to fourth upper reflective layers 221, 222, 223, and 224 may include a porous silicon oxide.

However, even in this case, the average diameters of the first to fourth pores PO4 of the first to fourth lower reflective layers 211, 212, 213, and 214 may be different. In addition, the average diameters of the first to fourth pores PO4 of the first to fourth upper reflective layers 221, 222, 223, and 224 may be different. In an implementation, the sizes of the pores PO of the first to fourth lower reflective layers 211, 212, 213, and 214 may decrease as the distance from the first surface 310*a* of the substrate 310 increases. The sizes of the pores PO of the first to fourth upper reflective layers 221, 222, 223, and 224 may increase as the distance from the first surface 310_a_ of the substrate 310 increases. A description thereof will be omitted since it is substantially the same as the embodiment of FIG. 1 to FIG. 7.

Alternatively, as shown in FIG. 11, a portion of the lower reflective layer 210 and a portion of the upper reflective layer 220 of the present embodiment may not include a porous material. In an implementation, when the first to fourth lower reflective layers 211, 212, 213, and 214 and the first to fourth upper reflective layers 221, 222, 223, and 224 each include a porous inorganic oxide, the second lower reflective layer 212, the fourth lower reflective layer 214, the second upper reflective layer 222, and the fourth upper reflective layer 224 may include a porous material. In addition, the first lower reflective layer 211, the third lower reflective layer 213, the first upper reflective layer 221, and the third upper reflective layer 223 may not include a porous material.

Figure 12:
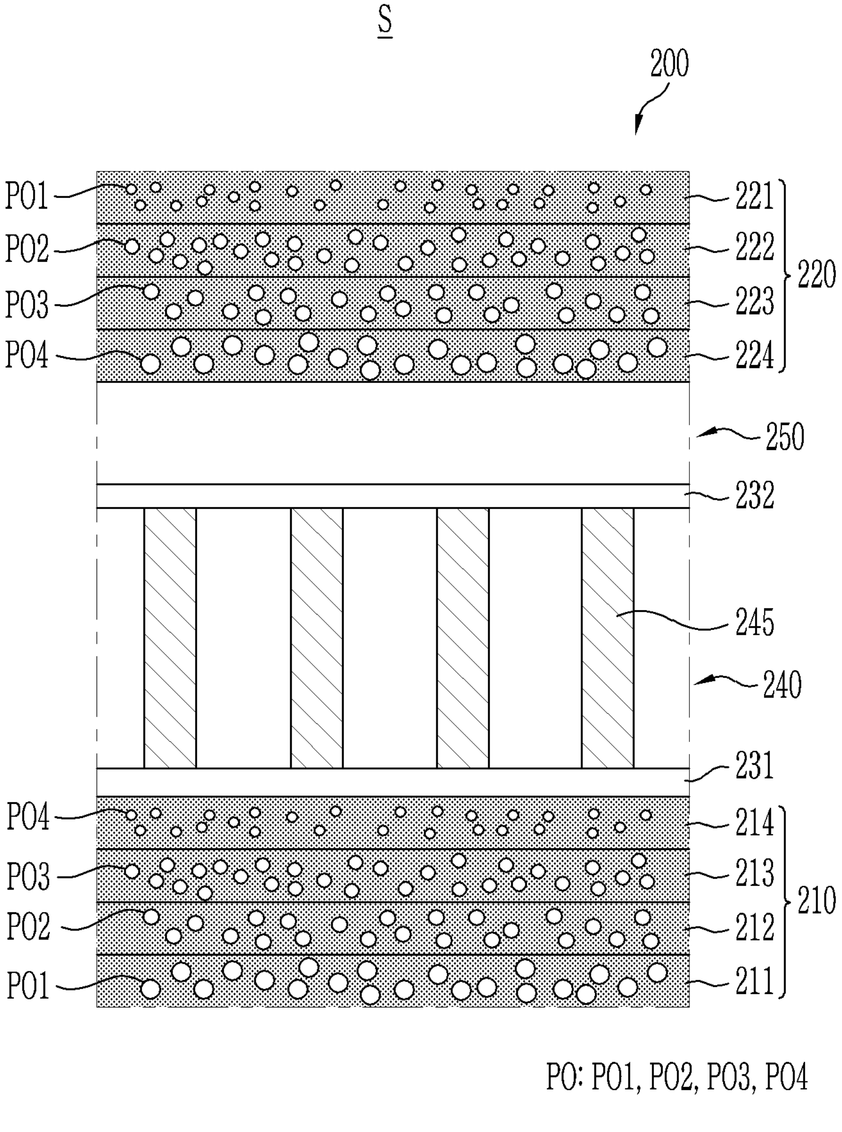
FIG. 12 is a cross-sectional view of a corresponding area "S" in FIG. 3 showing first through fourth upper reflective layers respectively having first through fourth pores, and first through fourth lower reflective layers respectively having first through fourth pores.

FIG. 12 shows a cross-sectional view corresponding to area "S" of FIG. 3 illustrating first through fourth upper reflective layers respectively having first through fourth pores, and first through fourth lower reflective layers respectively having first through fourth pores.

A manufacturing method of a semiconductor device according to an embodiment shown in FIG. 12 may be considerably the same as the manufacturing method of the semiconductor device according to the embodiment shown in FIG. 10, so differences will be mainly described. In addition, the same reference numerals are used for components that are the same as those of the previous embodiment. In this embodiment, the pore of the first reflective layer and the second reflective layer are partially different from that of the previous embodiment, which will be described below.

Referring to FIG. 12, like the previous embodiment, the image sensor 100 may include a substrate 310, a plurality of pixels PX, a filter layer 200, color filters CF, and micro lenses ML. The filter layer 200 may include a lower reflective layer 210, an upper reflective layer 220, and first and second band pass filters 240 and 250 between the lower reflective layer 210 and the upper reflective layer 220.

The sizes of the pores PO of the first to fourth lower reflective layers 211, 212, 213, and 214 of the previous embodiment may decrease as the distance from the first surface 310_a_ of the substrate 310 increases. In addition, the sizes of the pores PO of the first to fourth upper reflective layers 221, 222, 223, and 224 may increase as the distance from the first surface 310_a_ of the substrate 310 increases.

When the sizes of the pores PO of the first to fourth lower reflective layers 211, 212, 213, and 214 of the present embodiment may increase as the distance from the first surface 310_a_ of the substrate 310 increases, the sizes of the pores PO of the first to fourth upper reflective layers 221, 222, 223, and 224 may decrease as the distance from the first surface 310_a_ of the substrate 310 increases.

In an implementation, the average diameter of the first pores PO1 of the first lower reflective layer 211 may be substantially the same as the average diameter of the fourth pores PO4 of the fourth upper reflective layer 224. The average diameter of the second pores PO2 of the second lower reflective layer 212 may be substantially the same as the average diameter of the third pores PO3 of the third upper reflective layer 223. The average diameter of the third pores PO3 of the third lower reflective layer 213 may be substantially the same as the average diameter of the second pores PO2 of the second upper reflective layer 222. The average diameter of the fourth pores PO4 of the fourth lower reflective layer 214 may be substantially the same as the average diameter of the first pores PO1 of the first upper reflective layer 221. Hereinafter, a manufacturing method of an image sensor according to an embodiment will be described with reference to FIG. 13 to FIG. 22.

Figure 13:
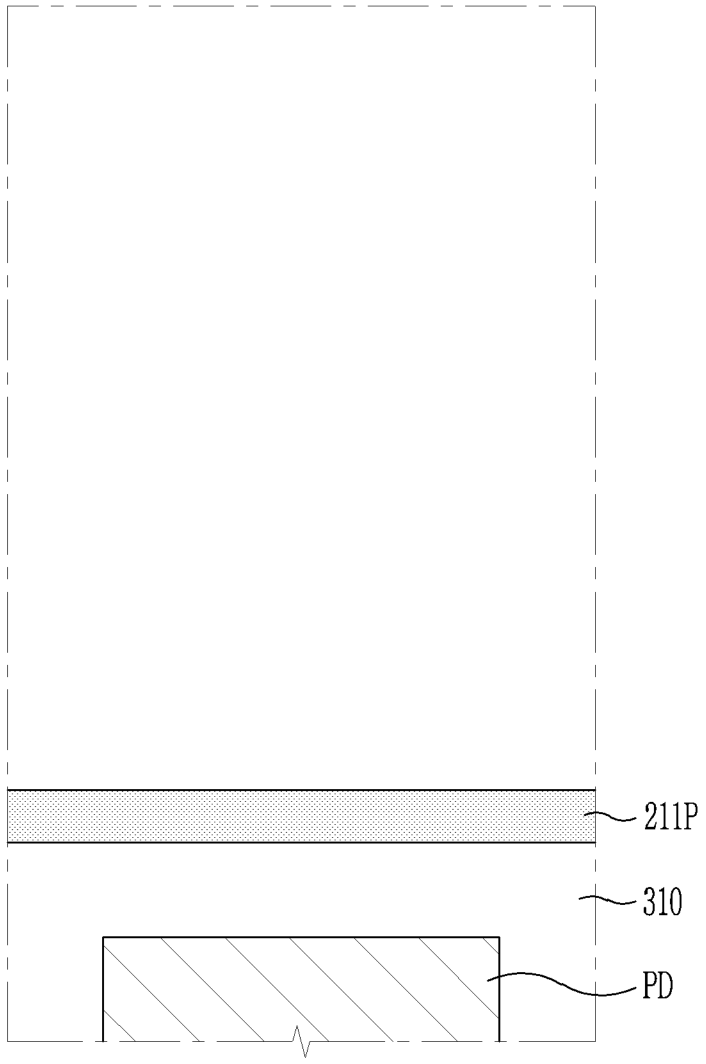
FIG. 13 is a cross-sectional view showing a first preliminary lower reflective layer formed in a manufacturing method of an image sensor according to an example embodiment.
Figure 14:
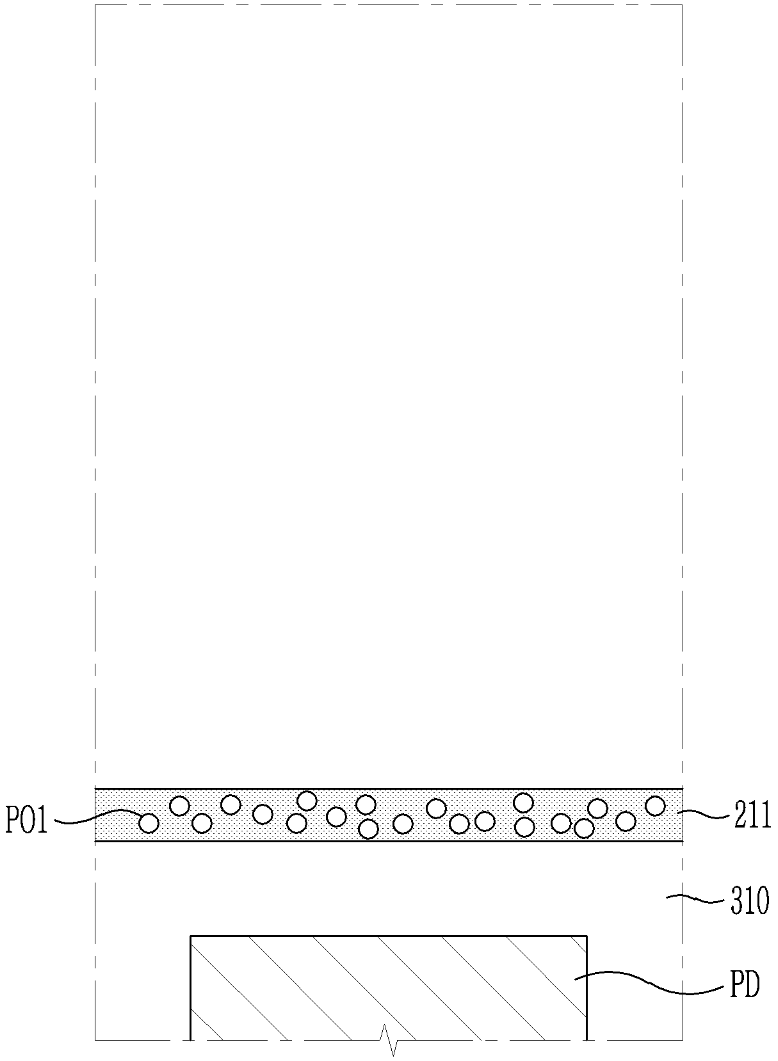
FIG. 14 is a cross-sectional view showing a first lower reflective layer being formed on the first preliminary lower reflective layer in a manufacturing method of an image sensor according to an example embodiment.

FIG. 13 is a cross-sectional view showing a first preliminary lower reflective layer formed in a manufacturing method of an image sensor according to an example embodiment. FIG. 14 is a cross-sectional view showing a first lower reflective layer being formed on the first preliminary lower reflective layer in a manufacturing method of an image sensor according to an example embodiment.

Figure 15:
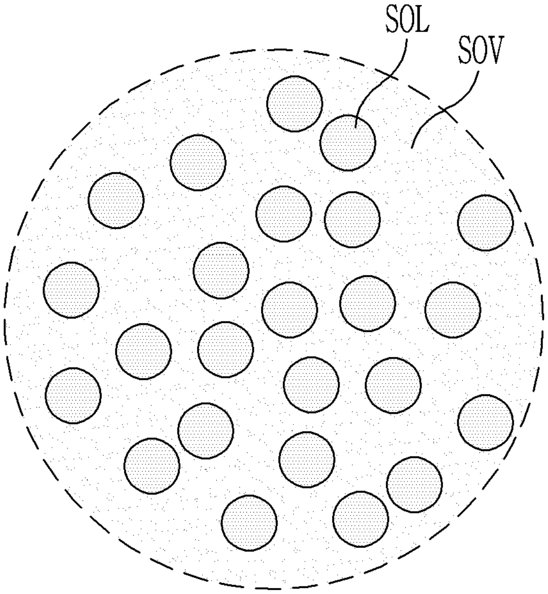
FIG. 15 is an enlarged view showing a manufacturing method of a reflective layer material including water being added to the inorganic oxide.
Figure 16:
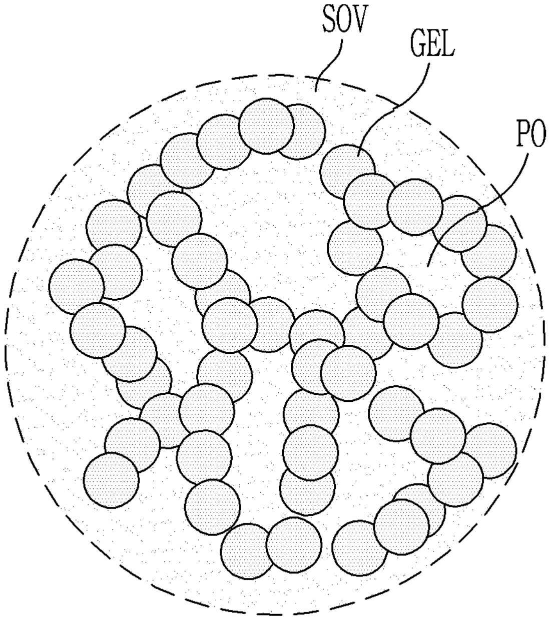
FIG. 16 is an enlarged view showing a manufacturing method of a reflective layer material, including forming a gel by adjusting the pH of the inorganic oxide solvent.
Figure 17:
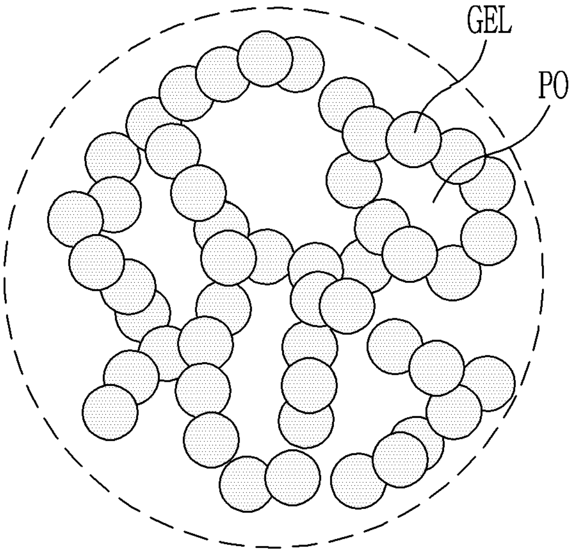
FIG. 17 is an enlarged view of a manufacturing method of a reflective layer material including, removing the inorganic oxide solvent through a drying process.

FIG. 15 shows an enlarged view of a manufacturing method of a reflective layer material including water being added to the inorganic oxide. FIG. 16 shows an enlarged view of a manufacturing method of a reflective layer material including forming a gel by adjusting the pH of the inorganic oxide solvent. FIG. 17 shows an enlarged view of a manufacturing method of a reflective layer material including removing the inorganic oxide solvent through a drying process.

As shown in FIG. 13, a first preliminary lower reflective layer 211P may be formed on the substrate 310. In this case, the photodiode PD may be in the substrate 310.

The first preliminary lower reflective layer 211P may include an inorganic oxide. In an implementation, the first preliminary lower reflective layer 211P may include tetrabutyl titanate. The first preliminary lower reflective layer 211P may include tetraethyl orthosilicate. Alternatively, it may include a metal oxide including aluminum (Al), hafnium (Hf), zirconium (Zr), tantalum (Ta), or yttrium Y. In this case, the inorganic oxide may be a precursor for forming the sol.

As shown in FIG. 14 to FIG. 17, the first lower reflective layer 211 may be formed on the first preliminary lower reflective layer 211P by using a sol-gel method. First, as shown in FIG. 15, water may be added to the inorganic oxide (e.g., tetrabutyl titanate) included in the first preliminary lower reflective layer 211P. Accordingly, a sol (SOL) may be formed through hydrolysis and condensation reaction of the inorganic oxide. Here, the sol (SOL) may be colloidal particles made of small solid particles. The sol (SOL) may be dispersed in an inorganic oxide solvent (SOV).

Subsequently, as shown in FIG. 16, a gel (GEL) may be formed by reacting the sol (SOL). In an implementation, the gel (GEL) may be formed by adjusting the pH of the inorganic oxide solvent (SOV) or by adding a salt. Here, the gel (GEL) may be a material in which colloidal particles in the inorganic oxide solvent (SOV) lose fluidity and harden into a solid or semi-solid state. The gel (GEL) may have a pore structure in which solid colloidal particles are connected to each other.

In this case, the concentration of the gel (GEL) may be determined according to the kind of precursor that forms the gel (GEL), the amount of material added during hydrolysis polymerization, the pH of the inorganic oxide solvent (SOV) forming the gel (GEL), and the type of salt to be added.

Finally, as shown in FIG. 17, the inorganic oxide solvent (SOV) may be removed through a drying process. In an implementation, the drying process may be performed through a process of removing the solvent while maintaining the pore structure of the gel (GEL), and the drying process may be performed by a supercritical drying process or a normal pressure drying process. In the supercritical drying process, a material is in a gaseous state at room temperature and normal pressure, but when a certain temperature and high pressure limit, called a supercritical point, is exceeded, an evaporation process does not occur, so the material is in a threshold state in which gas and liquid cannot be distinguished. In this state, the inorganic oxide solvent (SOV) may be removed by gradually removing the pressure.

As the inorganic oxide solvent (SOV) is removed while the pore structure of the gel (GEL) is maintained, the pores (PO) may be formed, and the first lower reflective layer 211 including the porous inorganic oxide may be formed.

Figure 18:
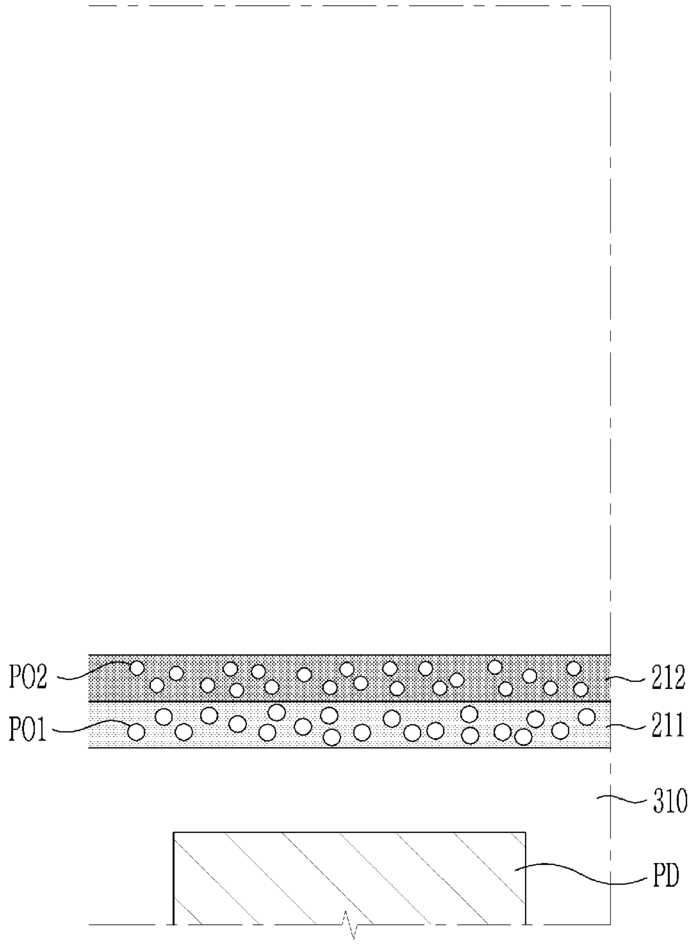
FIG. 18 is a cross-sectional view showing a second lower reflective layer formed on a first lower reflective layer in a manufacturing method of an image sensor according to an example embodiment.

FIG. 18 is a cross-sectional view showing a second lower reflective layer formed on a first lower reflective layer in a manufacturing method of an image sensor according to an example embodiment. As shown in FIG. 18, the second lower reflective layer 212 may be formed. To form the second lower reflective layer 212, tetraethyl orthosilicate may be used as a precursor. Since the process of forming the second lower reflective layer 212 may be substantially the same as that described in FIG. 14 to FIG. 17, it will be omitted. Accordingly, the second lower reflective layer 212 may include a porous inorganic oxide. In an implementation, the second lower reflective layer 212 may include a porous silicon oxide.

Figure 19:
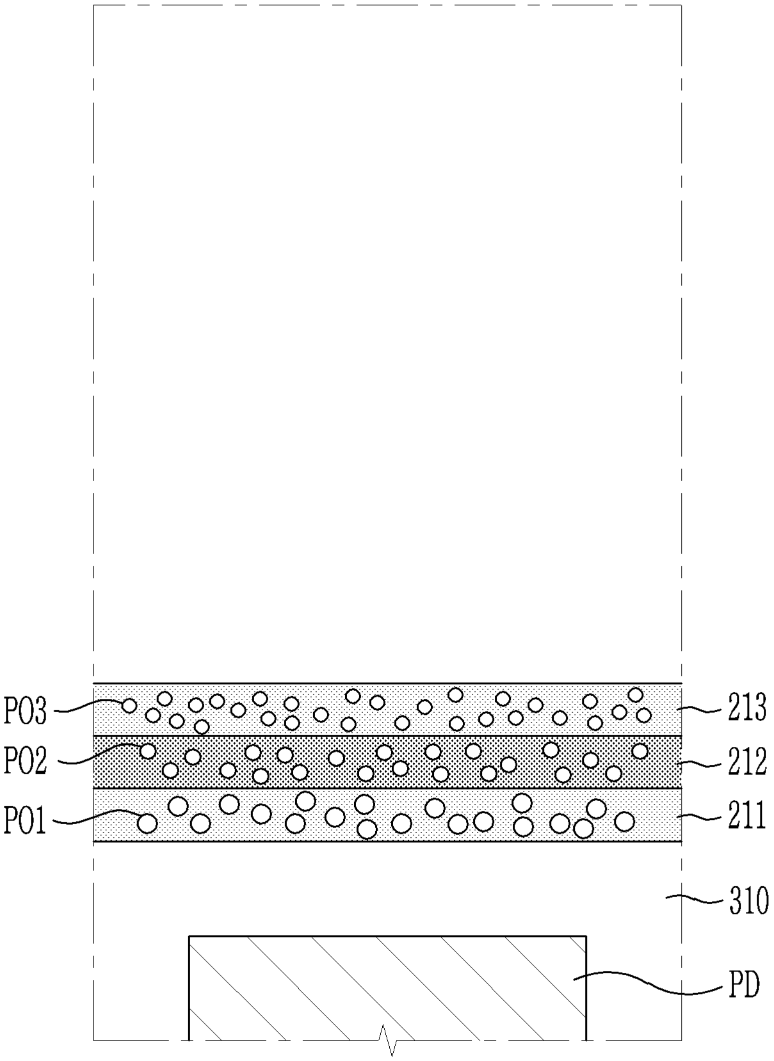
FIG. 19 is a cross-sectional view showing a third lower reflective layer formed on a second lower reflective layer in a manufacturing method of an image sensor according to an example embodiment.

FIG. 19 is a cross-sectional view showing a third lower reflective layer formed on a second lower reflective layer in a manufacturing method of an image sensor according to an example embodiment. As shown in FIG. 19, the third lower reflective layer 213 may be formed. Tetrabutyl titanate may be used as a precursor to form the third lower reflective layer 213. Since the process of forming the third lower reflective layer 213 may be substantially the same to that described in FIG. 14 to FIG. 17, it will be omitted. Accordingly, the third lower reflective layer 213 may include a porous inorganic oxide. In an implementation, the third lower reflective layer 213 may include a porous metal oxide including titanium (Ti), aluminum (Al), hafnium (Hf), zirconium (Zr), tantalum (Ta), or yttrium (Y).

Figure 20:
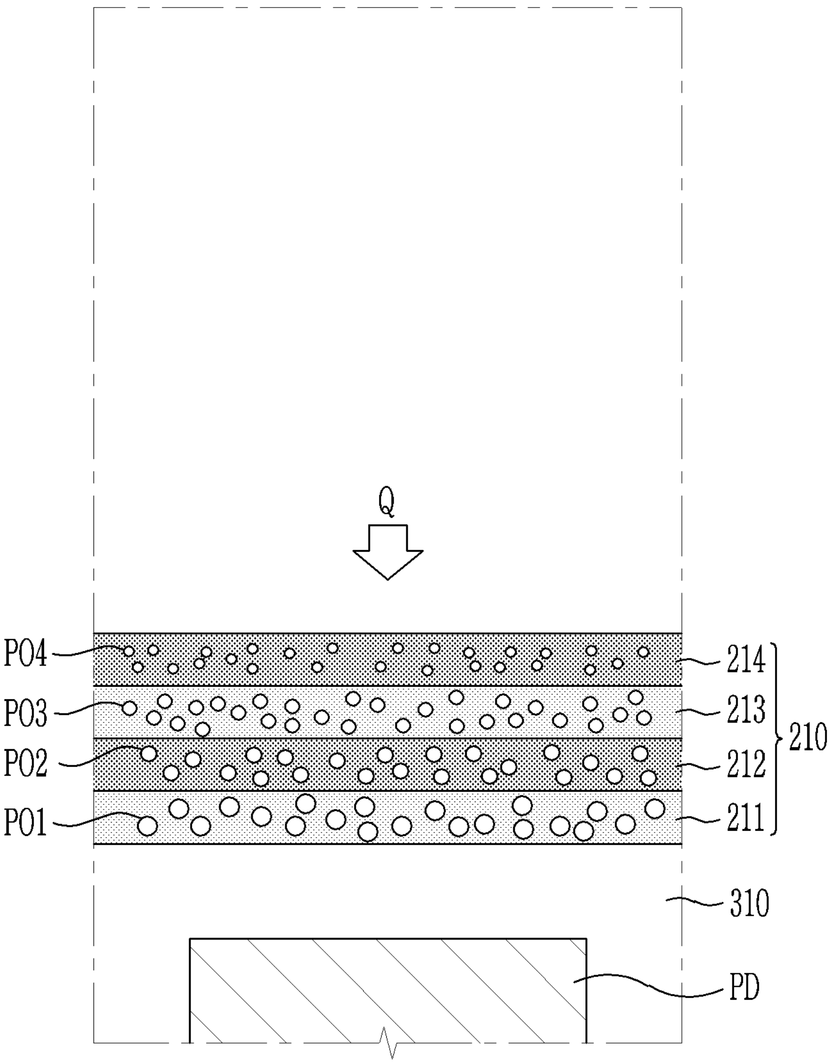
FIG. 20 is a cross-sectional view showing a fourth lower reflective layer formed on a third lower reflective layer in a manufacturing method of an image sensor according to an example embodiment.

FIG. 20 is a cross-sectional view showing a fourth lower reflective layer formed on a third lower reflective layer in a manufacturing method of an image sensor according to an example embodiment. As shown in FIG. 20, the fourth lower reflective layer 214 may be formed. To form the fourth lower reflective layer 214, tetraethyl orthosilicate may be used as a precursor. Since the process of forming the fourth lower reflective layer 214 may be substantially the same to that described in FIG. 14 to FIG. 17, it will be omitted. Accordingly, the fourth lower reflective layer 214 may include a porous inorganic oxide. In an implementation, the fourth lower reflective layer 214 may include a porous silicon oxide.

After forming the fourth lower reflective layer 214, an annealing process may be performed. The annealing process may cause recrystallization of the porous inorganic oxide by applying constant heat (Q) to the first to fourth lower reflective layers 211, 212, 213, and 214. Accordingly, the size of the pore of each of the first to fourth lower reflective layers 211, 212, 213, and 214 may be adjusted. The annealing process may be performed every time after each of the first to fourth lower reflective layers 211, 212, 213, and 214 are formed.

In this case, the average diameter of the first pores PO1 of the first lower reflective layer 211 may be greater than the average diameter of the third pores PO3 of the third lower reflective layer 213. In addition, the average diameter of the second pores PO2 of the second lower reflective layer 212 may be greater than the average diameter of the fourth pores PO4 of the fourth lower reflective layer 214. In addition, the average diameter of the first pores PO1 of the first lower reflective layer 211 may be greater than the average diameter of the first pores PO1 of the second lower reflective layer 212. The average diameter of the third pores PO3 of the third lower reflective layer 213 may be greater than an average diameter of the fourth pores PO4 of the fourth lower reflective layer 214. This may be adjusted according to the kind of precursor that forms the gel (GEL), the amount of material added during hydrolysis polymerization, the pH of the solution forming the gel (GEL), and the type of salt to be added, in the process of forming the gel (GEL).

The average diameter of the first pore PO1 of the first lower reflective layer 211 and the average diameter of the second pores PO2 of the second lower reflective layer 212 may be substantially the same. In addition, the average diameter of the third pores PO3 of the third lower reflective layer 213 and the average diameter of the fourth pores PO4 of the fourth lower reflective layer 214 may be substantially the same.

Figure 21:
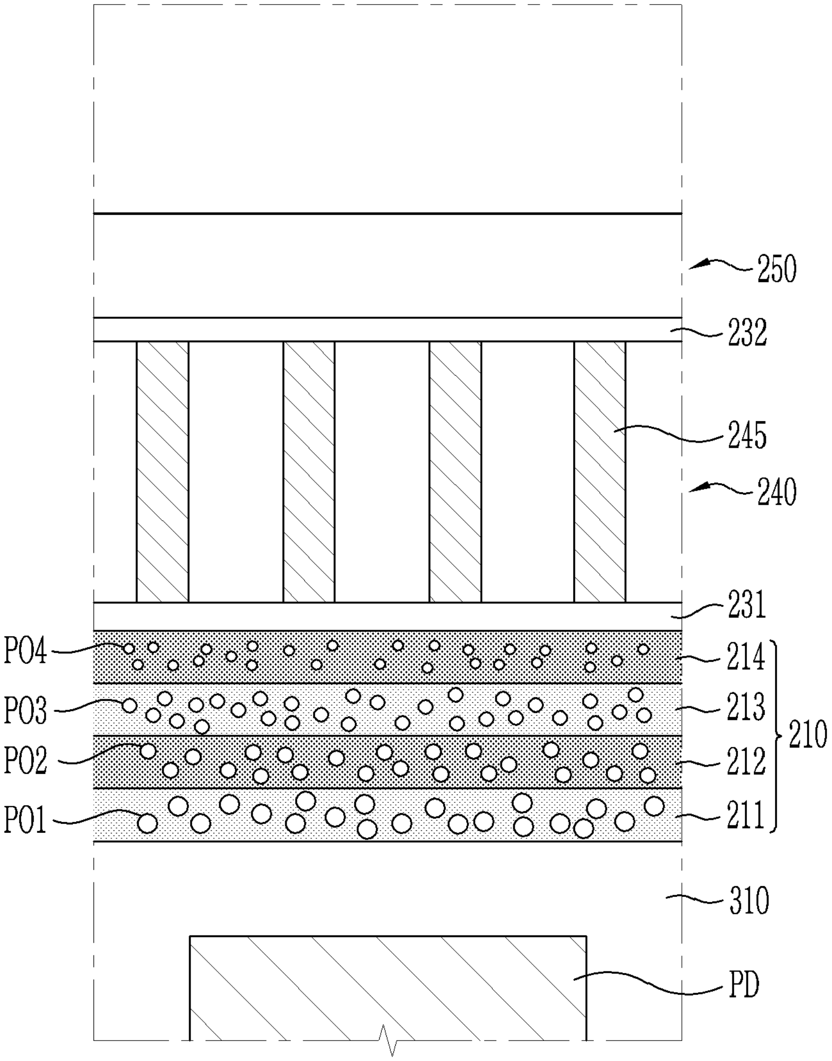
FIG. 21 is a cross-sectional view showing a first insulating layer, a first band pass filter, a second insulating layer, and a second band pass filter being sequentially formed on a lower reflective layer.

FIG. 21 is a cross-sectional view showing a first insulating layer, a first band pass filter, a second insulating layer, and a second band pass filter being sequentially formed on a lower reflective layer. As shown in FIG. 21, the first insulating layer 231, the first band pass filter 240, the second insulating layer 232, and the second band pass filter 250 may be sequentially formed on the lower reflective layer 210.

Figure 22:
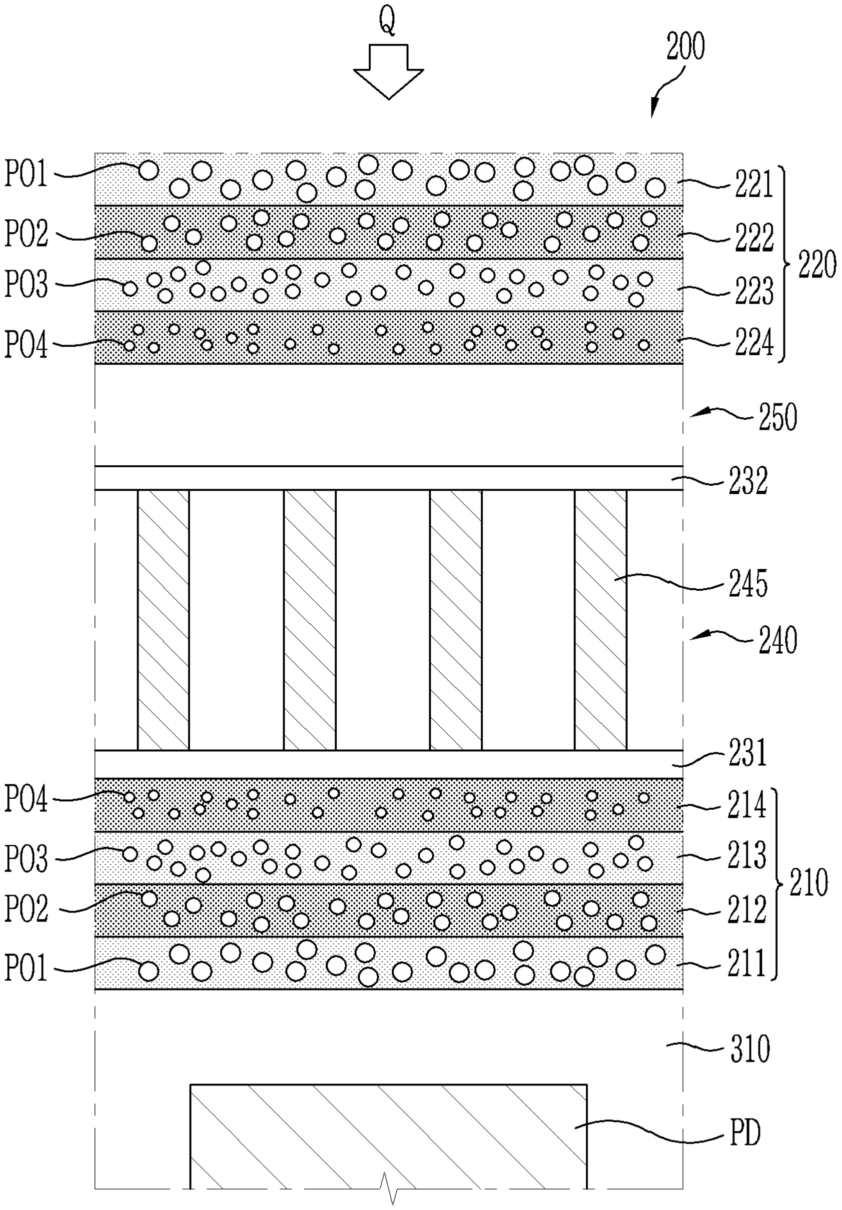
FIG. 22 is a cross-sectional view showing an upper reflective layer formed on a second band pass filter in a manufacturing method of an image sensor according to an example embodiment.

FIG. 22 is a cross-sectional view showing an upper reflective layer formed on a second band pass filter in a manufacturing method of an image sensor according to an example embodiment. As shown in FIG. 22, the upper reflective layer 220 may be formed on the second band pass filter 250. In an implementation, the fourth upper reflective layer 224, the third upper reflective layer 223, the second upper reflective layer 222, and the first upper reflective layer 221 may be sequentially formed on the second band pass filter 250.

The fourth upper reflective layer 224 may include the same material as the fourth lower reflective layer 214, and the third upper reflective layer 223 may include the same material as the third lower reflective layer 213. In addition, the second upper reflective layer 222 may include the same material as the second lower reflective layer 212, and the first upper reflective layer 221 may include the same material as the first lower reflective layer 211. The process of forming the first to fourth upper reflective layers 221, 222, 223, and 224 may be substantially the same as the process of forming the first to fourth lower reflective layers 211, 212, 213, and 214 in FIG. 14 to FIG. 20, so it will be omitted.

Finally, the image sensor 100 of FIG. 3 may be manufactured by forming the color filter CF on the upper reflective layer 220 and forming the micro lenses ML on the color filter CF. Hereinafter, an application example of the image sensor according to the embodiment will be described with reference to FIG. 23 to FIG. 25.

Figure 23:
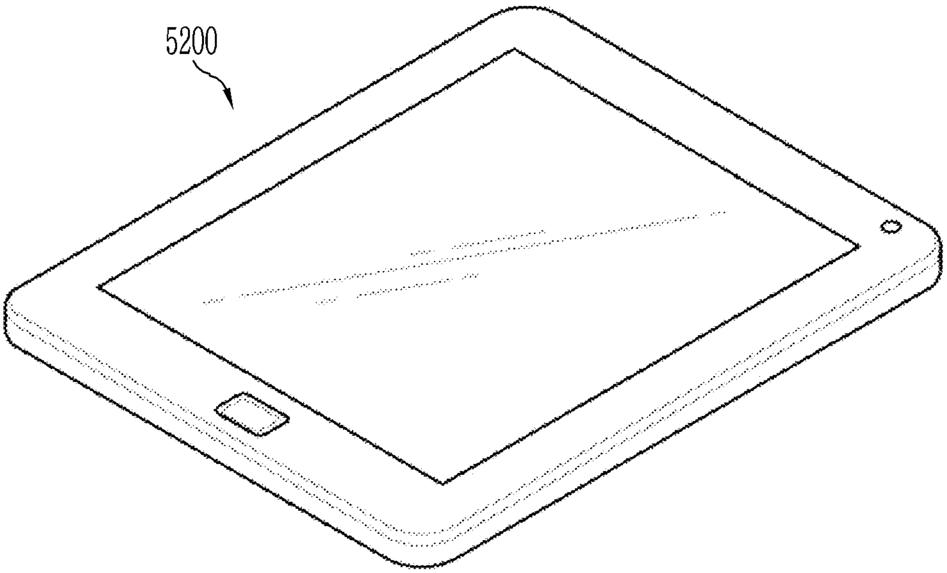
FIG. 23 is a perspective view of a smart tablet to which image sensors according to example embodiments are applied.
Figure 24:
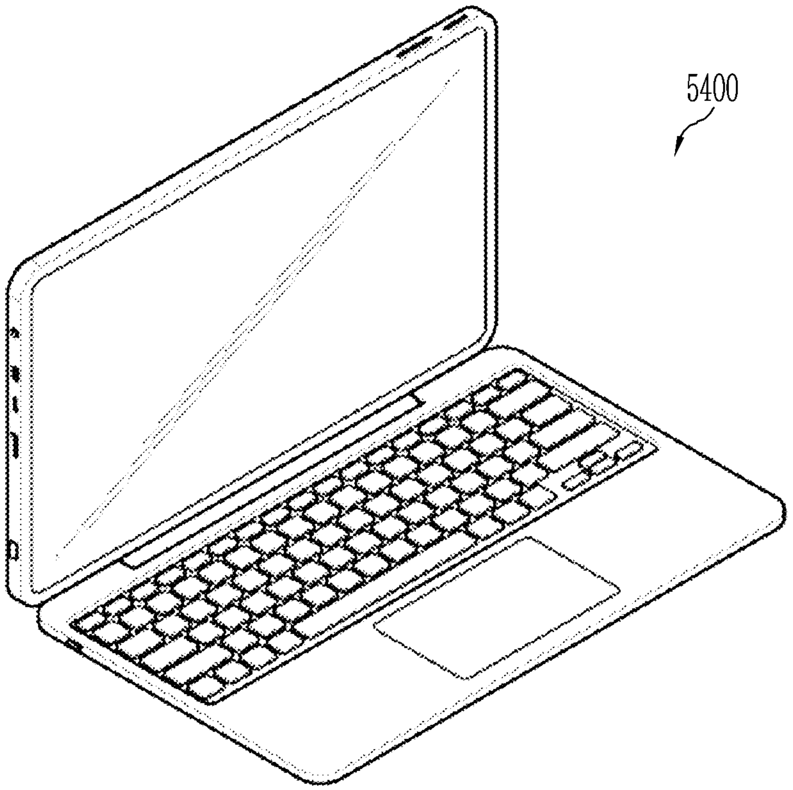
FIG. 24 is a perspective view of a laptop computer to which image sensors according to example embodiments are applied.
Figure 25:
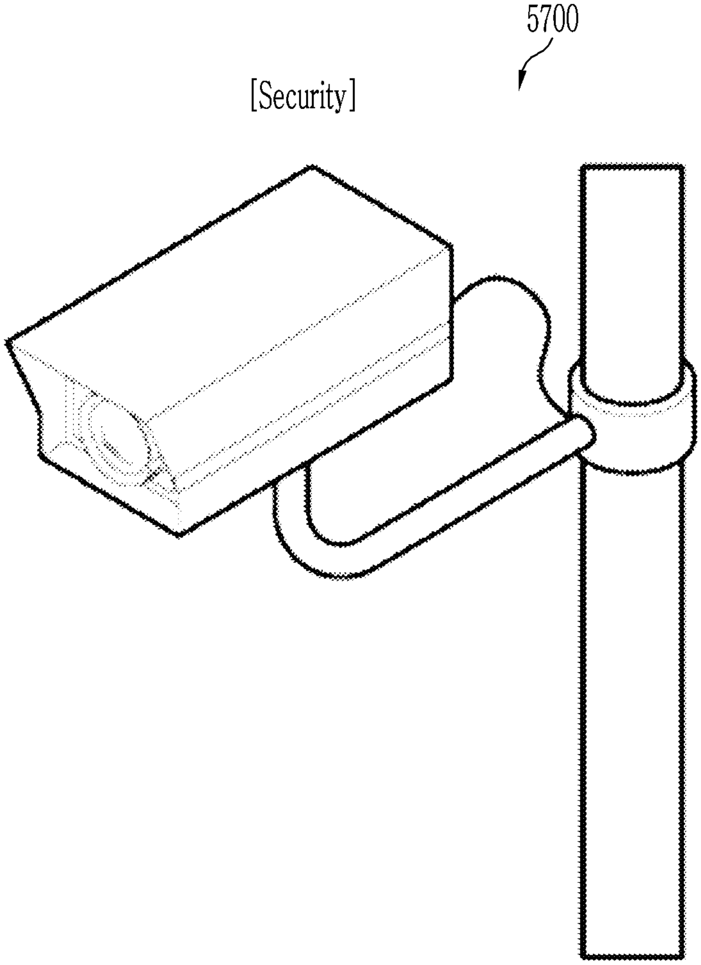
FIG. 25 shows a security camera to which image sensors according to example embodiments are applied.

FIG. 23 to FIG. 25 are drawings illustrating various examples of electronic devices to which image sensors according to example embodiments are applied. FIG. 23 shows a smart tablet to which image sensors according to example embodiments are applied. FIG. 24 shows a laptop computer to which image sensors according to example embodiments are applied. FIG. 25 shows a smart tablet to which image sensors according to example embodiments are applied.

The image sensor 100 according to the embodiments may be applied to a mobile phone or a smart phone, a tablet, or a smart tablet 5200 shown in FIG. 23, a laptop computer 5400 shown in FIG. 24, or a security camera 5700 shown in FIG. 25. In an implementation, the smart phone, or the smart tablet 5200 may include a plurality of high resolution cameras each equipped with a high resolution image sensor.

The high resolution camera may be used to extract depth information from subjects in an image, control out-focusing of the image, or automatically identify subjects in the image. The security camera 5700 may provide ultra-high resolution images and may recognize objects or people in the images even in a dark environment by using high sensitivity.

While the embodiment of the present disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

As those skilled in the art would realize, the described embodiments may be modified in various ways, all without departing from the spirit or scope of the present disclosure.

To clearly describe the present invention, parts or portions that are irrelevant to the description have been omitted, and identical or similar constituent elements throughout the specification have been denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side. An image sensor according to an embodiment will be described with reference to FIG. 1.

By way of summation and review, a pixel array configuring the CMOS image sensor includes a photoelectric conversion element such as a photodiode for each pixel. The photoelectric conversion element may generate an electrical signal that varies according to an amount of incident light, and the CMOS image sensor may synthesize an image by processing the electrical signal.

Recently, according to demands for high-resolution images, a pixel configuring the CMOS image sensor is required to be further down-sized. As the demand for down-sizing increases, incident light may not be properly sensed, or noise may occur due to interference between elements having increased integration. Despite the down-sizing of the CMOS image sensor, demands for image quality improvement and additional functions are increasing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:

a substrate;

a plurality of photodiodes disposed within the substrate;

a filter layer on the plurality of photodiodes, the filter layer having:

a lower reflective layer on the plurality of photodiodes;

a bandpass filter on the lower reflective layer, transmitting light of a first wavelength band, and reflecting light of remaining wavelength bands; and an upper reflective layer on the bandpass filter, each of the lower and upper reflective layers including a porous material;

a plurality of color filters on the filter layer; and a plurality of micro lenses on the plurality of color filters.

2. The image sensor as claimed in claim 1, wherein each of the lower and upper reflective layers includes a porous inorganic oxide.

3. The image sensor as claimed in claim 2, wherein each of the lower and upper reflective layers includes a porous silicon oxide and a porous metal oxide.

4. The image sensor as claimed in claim 1, wherein the porous material includes silicon oxide aerogel.

5. The image sensor as claimed in claim 1, wherein the bandpass filter includes:

first and second bandpass filters sequentially disposed on the lower reflective layer, and the lower and upper reflective layers being symmetrical to each other with respect to the first and second bandpass filters.

6. The image sensor as claimed in claim 1, wherein:

the lower reflective layer includes a first lower reflective layer and a second lower reflective layer sequentially stacked, the upper reflective layer includes a first upper reflective layer and a second upper reflective layer sequentially stacked, the first lower reflective layer and the second lower reflective layer include different porous inorganic oxides, and the first upper reflective layer and the second upper reflective layer include different porous inorganic oxides.

7. The image sensor as claimed in claim 6, wherein the first lower reflective layer and the first upper reflective layer include different porous inorganic oxides.

8. The image sensor as claimed in claim 6, wherein a first refractive index of the first lower reflective layer is different from a second refractive index of the second lower reflective layer.

9. The image sensor as claimed in claim 6, wherein a first average diameter of pores in the first lower reflective layer is different from a second average diameter of pores in the second lower reflective layer.

10. The image sensor as claimed in claim 9, wherein the first average diameter of pores in the first lower reflective layer is larger than the second average diameter of pores in the second lower reflective layer.

11. The image sensor as claimed in claim 6, wherein a porosity of the first lower reflective layer is larger than that of the second lower reflective layer.

12. The image sensor as claimed in claim 6, wherein:
the lower reflective layer further includes a third lower reflective layer on the second lower reflective layer,
the upper reflective layer further includes a third upper reflective layer on the second upper reflective layer,
the third lower reflective layer includes the same material as the first lower reflective layer, and
the third upper reflective layer includes the same material as the first upper reflective layer.

13. The image sensor as claimed in claim 12, wherein an average diameter of pores in the third lower reflective layer is different from that of pores in the first lower reflective layer.

14. An image sensor, comprising:
a substrate;
a plurality of photodiodes disposed within the substrate;
a filter layer on the plurality of photodiodes, the filter layer including:
a lower reflective layer on the plurality of photodiodes;
a first bandpass filter that is on the lower reflective layer, transmits light of a first wavelength band, and reflects light of remaining wavelength bands; and
an upper reflective layer on the first bandpass filter, a porous metal oxide layer and a porous silicon oxide layer being alternately stacked in each of the lower and upper reflective layers;
a plurality of color filters on the filter layer; and
a plurality of micro lenses on the plurality of color filters.

15. The image sensor as claimed in claim 14, wherein an average size of pores in the lower reflective layer decreases as the lower reflective layer moves away from the substrate.

16. The image sensor as claimed in claim 15, wherein an average size of pores in the upper reflective layer increases as the upper reflective layer moves away from the substrate.

17. The image sensor as claimed in claim 15, wherein the lower and upper reflective layers are symmetrical to each other with respect to the first bandpass filter.

18. An image sensor, comprising:
a substrate;
a plurality of photodiodes disposed within the substrate;
a filter layer on the plurality of photodiodes, the filter layer including:
a lower reflective layer that is on the plurality of photodiodes and includes a first lower reflective layer and a second lower reflective layer sequentially stacked;
an upper reflective layer that is on the lower reflective layer and includes a first upper reflective layer and a second upper reflective layer sequentially stacked; and
a first bandpass filter between the lower reflective layer and the upper reflective layer,
the first lower reflective layer and the second lower reflective layer include different porous inorganic oxides, and
the first upper reflective layer and the second upper reflective layer include different porous inorganic oxides;
a plurality of color filters on the filter layer; and
a plurality of micro lenses on the plurality of color filters.

19. The image sensor as claimed in claim 18, wherein the first lower reflective layer includes a porous metal oxide, and the second lower reflective layer includes a porous silicon oxide.

20. The image sensor as claimed in claim 19, wherein the first upper reflective layer includes a porous silicon oxide, and the second upper reflective layer includes a porous metal oxide.

* * * * *